US006855621B2

(12) United States Patent
Kondo et al.

(10) Patent No.: US 6,855,621 B2
(45) Date of Patent: Feb. 15, 2005

(54) METHOD OF FORMING SILICON-BASED THIN FILM, METHOD OF FORMING SILICON-BASED SEMICONDUCTOR LAYER, AND PHOTOVOLTAIC ELEMENT

(75) Inventors: Takaharu Kondo, Kyoto (JP); Masafumi Sano, Kyoto (JP); Akira Sakai, Kyoto (JP); Yasuyoshi Takai, Nara (JP); Ryo Hayashi, Nara (JP); Toshihiro Yamashita, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,427

(22) Filed: Oct. 24, 2001

(65) Prior Publication Data

US 2003/0153165 A1 Aug. 14, 2003

(30) Foreign Application Priority Data

Oct. 24, 2000 (JP) ........................................ 2000-323524
Oct. 23, 2001 (JP) ........................................ 2001-325691

(51) Int. Cl.$^7$ .......................... H01L 21/20; H01L 21/26; H01L 21/302; H01L 21/31

(52) U.S. Cl. ........................ 438/513; 438/485; 438/535; 438/707; 438/714; 438/726; 438/765

(58) Field of Search ................................ 438/485, 513, 438/535, 707, 714, 726, 765, 488, 774, 86, 96, 97, 482; 257/64

(56) References Cited

U.S. PATENT DOCUMENTS

| 4,842,897 | A | * | 6/1989 | Takeuchi et al. | ........ | 427/255.35 |
| 5,387,542 | A | | 2/1995 | Yamamoto et al. | ......... | 437/101 |
| 5,677,236 | A | * | 10/1997 | Saitoh et al. | ............... | 438/485 |
| 5,913,986 | A | * | 6/1999 | Matsuyama | .................. | 136/255 |

(List continued on next page.)

FOREIGN PATENT DOCUMENTS

| JP | 3-177077 | | 8/1991 | | |
| JP | 5-136062 | | 6/1993 | | |
| JP | 406302521 | * | 10/1994 | ......... | H01L/21/205 |

OTHER PUBLICATIONS

"On The Way Towards High Efficiency Thin–Film Silicon Solar Cells by the 'Micromorph' Concept," J. Meir, et al., Materials Research Society Symposium Proceedings, vol. 420 (1996), pp. 3–14.

"Thin–Film Polycrystalline Si Solar Cell on Glass Substrate Fabricated by a Novel Low Temperature Process," K. Yamamoto, et al., Jpn., J. Appl. Phys. vol. 33 (1994), pp. L1751–1754, Part 2, No. 12B, Dec. 15, 1994.

"Enhancement Of Optical Aborption For Below S$\mu$m–thin film poly–Si solar cell with STAR structure on glass substrate," K. Yamamoto, et al., 14th European Photovoltaic Solar Energy Conference, Barcelona, Spain, Jun. 30 to Jul. 4, 1997, pp. 1018–1021.

Primary Examiner—Carl Whitehead, Jr.
Assistant Examiner—David L. Hogans
(74) Attorney, Agent, or Firm—Fitzpatrick, Cella, Harper & Scinto

(57) ABSTRACT

The method of the present invention is a method of forming a silicon-based semiconductor layer by introducing a source gas into a vacuum vessel and forming a silicon-based semiconductor layer containing a microcrystal on a substrate introduced into the vacuum vessel by plasma CVD, which comprises a first step of forming a first region with a source gas containing halogen atoms, and a second step of forming a second region on the first region under a condition where the source gas containing halogen atoms in the second step is lower in gas concentration than that of the first step, thereby providing a method of forming a silicon-based semiconductor layer having an excellent photoelectric characteristic at a film forming rate of an industrially practical level and a photovoltaic element using the silicon-based semiconductor layer formed by the method.

8 Claims, 6 Drawing Sheets

U.S. PATENT DOCUMENTS

| | | | |
|---|---|---|---|
| 6,123,824 A | 9/2000 | Sano et al. | 205/124 |
| 6,159,763 A | 12/2000 | Sakai et al. | 438/97 |
| 6,172,296 B1 | 1/2001 | Iwasaki et al. | 136/256 |
| 6,265,288 B1 * | 7/2001 | Okamoto et al. | 438/485 |
| 6,303,945 B1 | 10/2001 | Saito et al. | 257/64 |
| 6,313,430 B1 | 11/2001 | Fujioka et al. | 219/121.57 |
| 6,331,474 B1 | 12/2001 | Hayashi et al. | 438/476 |
| 6,344,608 B2 | 2/2002 | Kariya et al. | 136/257 |
| 6,399,873 B1 | 6/2002 | Sano et al. | 136/249 |
| 6,452,091 B1 | 9/2002 | Nakagawa et al. | 136/261 |
| 6,468,829 B2 * | 10/2002 | Guha et al. | 438/96 |
| 6,472,248 B2 | 10/2002 | Shiozaki et al. | 438/97 |
| 6,495,392 B2 | 12/2002 | Sakai et al. | 438/96 |
| 2001/0030321 A1 * | 10/2001 | Saito et al. | 257/49 |

* cited by examiner

METHOD OF FORMING SILICON-BASED THIN FILM, METHOD OF FORMING SILICON-BASED SEMICONDUCTOR LAYER, AND PHOTOVOLTAIC ELEMENT

BACKGROUND OF THE INVENTION

1. Field of the Invention

This invention relates to a method of forming a silicon-based semiconductor layer, and a photovoltaic element produced by using the method. More particularly, this invention relates to a photovoltaic element such as a solar cell or a sensor, in which at least one set of a pin junction (or nip junction) has been deposited and which has high conversion efficiency and may cause less degradation even for long-time outdoor use, and also relates to a production method therefor, a construction material and a power generation system.

2. Related Background Art

As individual power sources for electric instruments or as substitute energy sources of system electric power, various photovoltaic elements have already been put into use. However, especially as a substitute for system electric power, photovoltaic elements are still in a high cost per power generation quantity. Accordingly, research and development concerning photovoltaic elements are energetically made in succession also at present.

For example, with regard to materials used at the most important part that takes over photoelectric conversion, technical research and development are being made on crystal type photovoltaic elements and thin-film type photovoltaic elements. The crystal type photovoltaic elements make use of single-crystal or polycrystalline silicon, and the thin-film type photovoltaic elements make use of amorphous or microcrystalline silicon, silicon-germanium or silicon carbide or compound semiconductors. Research and development have been made forward on the microcrystalline silicon, which, however, has behind been put into practical use compared with crystal materials and non-crystal materials.

In recent years, however, the microcrystalline silicon attracts notice in that good photoelectric conversion efficiency can be attained and any photodegradation is not seen at all, as reported by J. Meier, P. Torres, R. Platz, H. Keppner, A. Shah et al. (Mat. Res. Soc. Symp. Proc. Vol. 420, p. 3, 1996; hereinafter, referred to as "Document 1").

According to this Document 1, a photovoltaic element is produced by plasma-assisted chemical vapor deposition (plasma CVD) in which high-frequency power having a frequency of 70 MHz is supplied. This photovoltaic element is so constructed as to have one set of semiconductor junction. Then, it is reported that, in this photovoltaic element, a photoelectric conversion efficiency of 7.7% is attained and any photodegradation is not seen at all. The Document 1 further discloses that an initial photoelectric conversion efficiency of 13.1% and a photodegradation rate of −12.4% have been attained where a stacked photovoltaic element is produced in which amorphous silicon and microcrystalline silicon are placed one upon another.

In addition to the foregoing, there is a photovoltaic element reported by K. Yamamoto, A. Nakashima, T. Suzuki, M. Yoshimi, H. Nishio and M. Izumina (Jpn. J. Appl. Phys. Vol. 33, 1994, pp. L1751–L1754, Part 2, No. 12B, 15 Dec. 1994; hereinafter, referred to as "Document 2"). This report shows an example in which a p-type layer doped with boron in a high concentration is subjected to laser annealing and a columnar microcrystalline structure is provided thereon.

As a method of forming a silicon semiconductor layer which shows crystallizability, a method such as casting has conventionally been carried out in which the layer is grown from a liquid phase. This method, however, requires high-temperature treatment, and has had a subject for mass production and cost reduction.

As a method of forming a silicon semiconductor layer which shows crystallizability, other than the casting, Japanese Patent Application Laid-Open No. 5-136062 (hereinafter, referred to as "Document 3") discloses a method in which amorphous silicon having been formed is subjected to hydrogen plasma processing and this is repeated to form a polycrystalline silicon film.

In general, in photovoltaic elements making use of the silicon semiconductor layer which shows crystallizability, it is known that the mobility of carriers is impaired because of, e.g., the influence of dangling bonds and so forth of silicon at crystal grain boundaries, any strain or distortion produced in the vicinity of grain boundaries, and any imperfectness of crystals themselves to adversely affect photoelectric characteristics required as photovoltaic elements.

As a countermeasure for bringing the photoelectric characteristics to be less affected, it is considered effective to improve crystallinity and crystallizability and to make crystal size larger to lower the density of crystal grain boundaries. As a means for the achievement of these, it must be designed to lower film-forming rate or to form films while repeating the formation of silicon film and its annealing in an atmosphere of hydrogen.

Japanese Patent Application Laid-Open No. 3-177077 (hereinafter, referred to as "Document 4") also discloses a technique in which an i-type semiconductor layer comprised of amorphous silicon is formed in a stacked construction consisting of two different semiconductor layers (a) and (b). Here, one semiconductor layer (a) is formed as a layer mainly composed of silicon atoms and containing hydrogen atoms in an amount of from 0.1 to 10 atomic % and fluorine atoms of from 0.01 to 0.5 atomic %, and the other semiconductor layer (b) is formed as a layer mainly composed of silicon atoms and containing hydrogen atoms in an amount of from 20 to 40 atomic % and formed in a layer thickness of from 10 to 100 Å. Thus, any film surface defects can be compensated, and a photoelectric conversion device having superior characteristics can be obtained.

This technique has made it possible to greatly improve the characteristics of amorphous silicon film.

However, the techniques disclosed in Documents 1 to 4 have the following problems. That is, in the case of the microcrystalline silicon ($\mu$C—Si) photovoltaic element of Document 1, although any photodegradation is not seen at all, only low conversion efficiency, i.e., a short-circuit current of 25.4 mA/cm$^2$ and a photoelectric conversion efficiency of 7.7% have been achieved for a layer thickness of 3,600 nm. In addition, the $\mu$C—Si layer has a layer thickness of as large as 3,600 nm. Besides, its deposition rate is as low as 0.12 nm/sec, and it must take about 8 hours to form the layer. Thus, there is a problem that this photovoltaic element is not on an industrially practical level.

In the case of the technique of Document 2, only much lower conversion efficiency, i.e., a short-circuit current of 14.3 mA/cm$^2$ and a photoelectric conversion efficiency of 7.7% have been achieved in a layer thickness of 2,000 nm.

The technique disclosed in Document 3 also provides the cause of a longer film formation time and a higher cost.

In addition, the technique disclosed in Document 4 can not necessarily be a sufficient measure to solve the problem on photodegradation because the semiconductor layer is formed of amorphous silicon, thus there is room for further improvement.

Now, in recent years, the group who has reported in Document 2 has advanced the technique, and reports that a short-circuit current of 26.12 mA/cm$^2$ and a photoelectric conversion efficiency of 9.8% have been achieved in a layer thickness of 3,500 nm (14th European Photovoltaic Solar Energy Conference, Barcelona, Spain, Jun. 30 to 4 Jul. 1997, pp. 1018–1021). However, the conversion efficiency and the productivity are both still insufficient.

SUMMARY OF THE INVENTION

An object of the present invention is to solve the above-described problems and thereby provide a method of producing a silicon-based thin film and a method of producing a silicon-based semiconductor layer which have a high photoelectric conversion efficiency for supplying a large amount of current; a photovoltaic element; and a production method therefor.

Another object of the present invention is to provide a method of producing a silicon-based thin film and a method of producing a silicon-based semiconductor layer, which make it possible to produce the film and the layer having a good photoelectric conversion efficiency even under conditions of a high deposited rate and a relatively small thickness and to inexpensively produce them at a low temperature with excellent productivity; a photovoltaic element; and a production method therefor.

Still another object of the present invention is to provide a method of producing a silicon-based thin film and a method of producing a silicon-based semiconductor layer which are relatively inexpensive and overall excellent in use for a long term; a photovoltaic element; a production method therefor; a constructional material; and a power generating apparatus.

A further object of the present invention is to provide a method of forming a silicon-based thin film, which comprises introducing a source gas into a vacuum vessel, and forming a silicon-based thin film containing a microcrystal having a crystal grain size of 10 nm or more in Scherrer radius on a substrate introduced into the vacuum vessel by plasma CVD, the silicon-based thin film comprising a first silicon-based thin film region and a second silicon-based thin film region, wherein the first silicon-based thin film region is formed with a source gas containing silicon halide and hydrogen by high frequency plasma CVD using microwave, and then the second silicon-based thin film region is formed to be stacked on the first silicon-based thin film region by high frequency plasma CVD using VHF.

A still further object of the present invention is to provide a photovoltaic element comprising semiconductor layers having at least one pin junction on a substrate, at least one i-type semiconductor layer of the photovoltaic element comprising a silicon-based thin film formed by a method of forming a silicon-based thin film, which comprises introducing a source gas into a vacuum vessel, and forming a silicon-based thin film containing a microcrystal having a crystal grain size of 10 nm or more in Scherrer radius on the substrate introduced into the vacuum vessel by plasma CVD, wherein a first silicon-based thin film region is formed with a source gas containing silicon halide and hydrogen by high frequency plasma CVD using microwave, and then a second silicon-based thin film region is formed to be stacked on the first silicon-based thin film region by high frequency plasma CVD using VHF.

A still further object of the present invention is to provide a method of forming a silicon-based semiconductor layer by introducing a source gas into a vacuum vessel and forming a silicon-based semiconductor layer containing a microcrystal on a substrate introduced into the vacuum vessel by plasma CVD, which comprises a first step of forming a first region with a source gas containing halogen atoms, and a second step of forming a second region on the first region under a condition where the source gas containing halogen atoms is absent or a condition where the source gas containing halogen atoms in the second step is lower in gas concentration than that in the first step.

A still further object of the present invention is to provide a photovoltaic element comprising a silicon-based semiconductor layer containing a microcrystal and composed of at least a first region and a second region stacked on the first region, wherein a first region contains halogen atoms, and a second region has a content of halogen atoms smaller than that in the first region.

DESCRIPTION OF THE PREFERRED EMBODIMENTS

Figure 1:
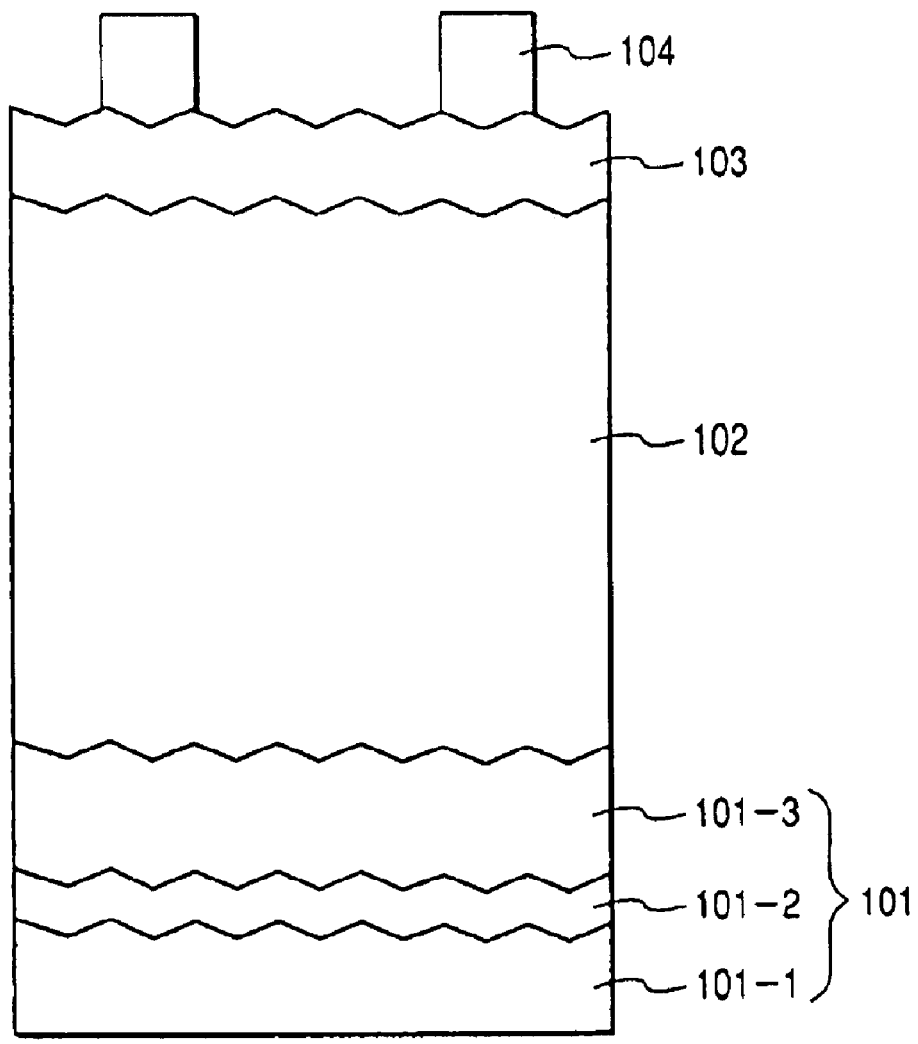
FIG. 1 is a schematic sectional view showing an example of the photovoltaic element of the present invention.

As a result of extensive studies made in order to solve the problems discussed previously, the present inventors took note of the influence a silicon halide may have on silicon films in respect of a method in which source gases (material gses) are fed into a vacuum vessel (vacuum reactor) and a silicon-based semiconductor layer containing microcrystals is formed by plasma-assisted CVD on a substrate brought into the vacuum vessel.

As the result, they have discovered that a silicon-based semiconductor layer having superior crystallinity, crystallizability and orientation property and also having good adhesion to the underlying layer can be formed at a high rate where, in the initial step (first step) in forming the silicon-based semiconductor layer containing microcrystals, a first region is formed under conditions of formation in which a silicon halide contains at least one kind of fluorine atoms and chlorine atoms, and, in its latter step (second step), a second region is superposingly formed on the first region under conditions of formation in which a source gas containing at least one kind of fluorine atoms and chlorine atoms is in a quantity smaller than that in the first step. They have also discovered that a photovoltaic element having a good photoelectric conversion efficiency and having superior adhesion and environmental resistance can be formed at a low cost where, in a photovoltaic element having at least one set of pin junction (or nip junction) deposited, the above silicon-based semiconductor layer is used as at least one i-type semiconductor layer.

(Silicon-based Semiconductor Layer Containing Microcrystals in the Present Invention)

In the present invention, in view of characteristics, the silicon-based semiconductor layer containing microcrystals may preferably be, but not particularly limited to, a silicon-based semiconductor layer containing microcrystals having a crystal grain size of 10 nm or larger as Scherrer radius.

The layer having the above construction can bring about the following operation and effect.

A method of forming the silicon-based semiconductor layer containing microcrystals (a crystal phase) by plasma-assisted CVD making use of high-frequency power is more advantageous for cost reduction than solid-phase reaction because the processing time is short and also the processing temperature can be made lower. This effect is greatly brought out especially when the present invention is applied to the step of forming an i-type layer in a photovoltaic element having a pin junction (or nip junction), under conditions so set that a first i-type semiconductor region (layer) forms nuclei of Si and a second or further i-type semiconductor region (layer) makes the nuclei of Si grow. This effect is more greatly brought out in a photovoltaic element having two or more pin junctions (or nip junctions) formed superposingly.

In the photovoltaic element having a pin junction (or nip junction), where the i-type semiconductor layer that functions substantially as a light absorption layer is formed as an i-type semiconductor layer containing a crystal phase, the phenomenon of photodegradation due to the Staebler-Wronski effect, which comes into a problem in the case of amorphous components, can be inhibited as an additional effect.

In the mean time, as a problem caused when the silicon-based semiconductor layer containing a crystal phase is employed in the i-type semiconductor layer, it is known that crystal grain boundaries affect both majority carriers and minority carriers to degrade performances. In order to inhibit the effect of the crystal grain boundaries, it is considered to be an effective means to enlarge crystal grain size in the i-type semiconductor layer to lower its crystal grain boundary density. In particular, it is preferable for the microcrystals to have a large crystal grain size in the direction of carriers' movement, and it is preferable for them to have a Scherrer radius of 10 nm or larger when the direction of carriers' movement is regarded as the plane normal.

As a factor for enlarging the crystal grain size, it may be exampled to make the orientation property of crystals higher. Where the deposition of a film proceeds in a random crystal direction, it is considered that individual crystal grains collide against one another in the course of growth and the size of crystal grains becomes small. Such random mutual collision of crystals can be controlled by orienting the crystals in a specific direction, so that the crystal grain size can be made larger, as so considered. Also, in the photovoltaic element having a pin junction (or nip junction), the random mutual collision of crystal grains can be controlled by forming the i-type layer under conditions so set that a first i-type semiconductor layer region forms nuclei of Si and a second or further i-type semiconductor layer region makes the nuclei of Si grow, and also by making the orientation in a specific direction to uniform the directionality of growth, so that the crystal grain size can be made larger, as so considered.

In crystalline silicon having a diamond structure, (220)-plane has the highest in-plane atom density, and the silicon atom in the growth surfacemost plane has a structure wherein three dangling bonds among the four dangling bonds are joined to other silicon atoms by covalent bonding. Hence, it is considered that, when this plane is used as the growth plane, the silicon-based semiconductor layer having good adhesion and weatherability can be formed desirably.

From an ASTM card, in non-oriented crystalline silicon the proportion of diffraction strength of (220)-plane with respect to the total sum of diffraction strength corresponding to eleven reflections from the low-angle side is about 23%, and it follows that any structure in which the proportion of diffraction strength of (220)-plane is larger than 23% has the orientation property in this plane direction. In particular, a structure in which the proportion of diffraction strength of (220)-plane is 50% or larger can more bring out the above effect, and is particularly preferred.

(First Silicon-based Semiconductor Layer Region)

In the case where the silicon-based semiconductor layer having superior crystallinity, crystallizability and (220)-orientation property is formed by plasma-assisted CVD making use of high-frequency power, it is considered that there are proper reaction forms in the respective stages, i.e., in the course of formation of good crystal nuclei and in the course of crystal growth on the crystal nuclei serving as seeds. In order to materialize this state, production process factors such as frequency of high-frequency power used and types of source gases may be combined in the respective stages, thus the silicon-based semiconductor layer can more effectively be formed.

The course of formation of the crystal phase is considered as follows: The formation of nuclei larger than the critical radius that depends on the equilibrium of a change in free energy caused by crystallization and a change in free energy for making up the surface area takes place first, and then, after the crystal nuclei have been formed and where the growing of crystals around existing crystal nuclei is more advantageous in view of energy than the generation of new crystal nuclei which is accompanied with an increase in surface area energy, the growth of crystal nuclei proceeds in such a form that the structure of crystal nuclei is taken over rather than the new crystal nuclei are generated.

In order to obtain a silicon-based semiconductor layer having a large crystal grain size, it is first necessary at the initial stage of crystal growth to form crystal nuclei having a low crystal nucleus density and having the (220)-orientation. Then, at the stage where the individual crystal grains having grown from the crystal nuclei have grown to come into contact with each other, it is considered desirable that the re-location of atoms takes place in respect of the in-plane rotational direction in order to reduce any structural mismatching between crystal grains, because the individual crystal grains have uniform orientation property in the thickness direction but have random orientation property in the in-plane rotational direction.

In the first silicon-based semiconductor layer region thus formed, compared with the second silicon-based semiconductor layer region, which serves as a crystal growth region subsequent to the first one, it is considered desirable to form the silicon-based semiconductor layer under conditions of formation which are relatively richer in etching effect and in active state capable of more readily bringing atoms into re-location.

As the method of forming the first silicon-based semiconductor layer region, the high-frequency plasma-assisted CVD making use of a source gas containing hydrogen and a silicon halide such as silicon fluoride is preferred, which makes use of a reaction mechanism where etching reaction is simultaneously carried out in addition to the film deposition reaction as described above. In this method, various active species such as $SiX_nH_m$ ($0 \leq n$, $m \leq 4$), HX, X and H (X is a halogen atom) are formed in plasma. Details are unclear about the function these active species has. It is considered that what is characteristic is in that there are active species which contribute to the etching reaction in addition to active species which contribute to the deposition of the silicon-based semiconductor layer, and the (220)-plane can selectively be made into the growth plane by controlling plasma processing in such a way that the deposition of film proceeds while etching the Si—Si bonds having a relatively weak bonding force.

In the course of etching reaction, radicals are also formed as the bonds are cut, so that the structural relaxation is promoted, and hence this enables formation of a good silicon-based semiconductor layer at a lower processing temperature without regard to the structure of the underlying layer, as so considered. At the same time, the region having a weak bonding force to the underlying layer is etched, and hence this also enables formation of a silicon-based semiconductor layer having superior adhesion to the underlying layer, as so considered. In order to form these active species, it is considered necessary to provide the course of active reaction of a halogen-containing compound such as $SiX_4$ (X is a halogen atom) with hydrogen radicals. It is also considered that the hydrogen radicals promote the liberation of excess X atoms in the deposited film and diffuse over the vicinity of the growth plane to activate the structural relaxation, and hence act to improve the crystallizability and also cause the re-location of atoms.

From the foregoing, it is also important that many hydrogen radicals are present in the vicinity of the substrate when the first silicon-based semiconductor layer is formed. For this end, it is preferable to use high-frequency power having a high ability to cut the bonds. Here, as the range of the high frequency used in the present invention, it may preferably be in the range between higher than 10 Hz and not higher than 10 GHz. Meanwhile, when the first silicon-based semiconductor layer region is formed, it is preferable to use microwaves ranging between higher than 500 MHz and not higher than 10 GHz, more preferable to use microwaves of from 700 MHz to 5 GHz, and still more preferable to use microwaves of from 2 GHz to 3 GHz.

In order to make the hydrogen radicals present in a greater number, it is preferable to add means for, e.g., making higher the proportion of hydrogen gas in the source gases, making smaller the distance between a high-frequency power feed means and the substrate, or introducing the hydrogen radicals into the vicinity of the substrate by a feed means different from the source gas feed means.

The high-frequency power may be applied by using, e.g., a commonly available parallel-plate type application method, in which the high-frequency power is introduced through a metal electrode making use of a coaxial cable. The metal electrode may preferably be one having a plurality of holes at the surface and having the function to introduce the gas in the form of a shower.

(Second Silicon-based Semiconductor Layer Region)

Formation of the second silicon-based semiconductor layer region by high-frequency plasma-assisted CVD enables formation of a crystal phase on the first silicon-based semiconductor layer region at a high rate; the crystal phase having a high uniformity and a structure having extended from the first silicon-based semiconductor layer region. This is based on a finding made by the present inventors, i.e., a finding that, since the first region has been made into crystal nuclei having high crystallizability and high quality as having been formed under the conditions accompanied with the etching reaction as described previously, the crystal growth can be continued without damaging the crystallizability (because the underlying first region has a high crystallizability) even when the second region to be formed thereon is deposited at a high rate.

The above high-frequency power may preferably be applied by the same method as the application method used when the first silicon-based semiconductor layer region is formed.

As the high-frequency power, usable are microwave power, VHF power and RF power. Accordingly, how to apply each high-frequency power is supplemented below.

In a high-frequency plasma method making use of the microwave power, electrodeless discharging is commonly used in which high-frequency power is applied by utilizing a dielectric window made of quartz, alumina, aluminum nitride or the like. In a high-frequency plasma method making use of the VHF power or RF power, however, high-frequency power is applied through the metal electrode making use of a coaxial cable, and hence it is relatively easy to form a highly uniform silicon-based semiconductor layer over a large area by making the electrode larger or designing the shape of the electrode. In addition, where a roll-to-roll system is employed in combination, the number of high-frequency power source necessary for each discharge space can be made smaller, and hence this enables reduction of system cost. This effect is meaningful especially when the second silicon-based semiconductor layer region held in the silicon-based semiconductor layer region is constructed to have a larger thickness than the first silicon-based semiconductor layer region.

In the second silicon-based semiconductor layer region, compared with the first silicon-based semiconductor layer region, the formation of a good-quality crystal phase at a high rate takes preference over the formation of new crystal nuclei and re-location of atoms. In the high-frequency plasma method making use of the microwave power, what can make movement following the high-frequency power in plasma is considered to be chiefly electrons. On the other hand, in the high-frequency plasma method making use of the VHF power or RF power, at least part of ions follows the high-frequency power and their implantation into the electrode or ground surface is actively performed, thus a relatively large self-bias is formed. Hence, the reaction that requires the action of etching is not actively performed, but on the other hand the effect of increasing deposition rate is improved. Especially when high-frequency power having a VHF frequency is used, the effect of increasing deposition rate is great.

Here, as the range of VHF, a high frequency of from 30 MHz to 500 MHz may be used, where the effect of implantation of hydrogen into the crystal growth surface and interior is enhanced to inactivate crystal grain boundaries further, and this enables formation of a good-quality crystal phase having the structure having extended from the first silicon-based semiconductor layer region. Thus, such a high frequency is preferred. The frequency may more preferably be in a frequency region of from 40 MHz to 200 MHz, and more preferably be in a frequency region of from 50 MHz to 150 MHz.

As for source gases used to form the second silicon-based semiconductor layer region, a source gas composed of a silane gas and hydrogen may be used. Such a source gas is particularly preferred when the film is formed at a high rate, because active species contributory to the etching action is in an especially small proportion.

As a method of forming the second silicon-based semiconductor layer region, the like effect can be obtained also when the source gas containing a silicon halide such as silicon fluoride is introduced in the same manner as the above. However, in order to enhance the deposition rate taking account of productivity, a deposition means may preferably be used in which the etching reaction like the above is not carried out. Accordingly, in the step of forming the second region, preferred is a high-frequency plasma-assisted CVD method in which any source gas containing a silicon halide such as silicon fluoride is not introduced and a gas not containing any halogen, such as $SiH_4$, is used.

Taking account of the advantages that the phenomenon of photodegradation due to the Staebler-Wronski effect, caused by amorphous components, can be kept from occurring and also the crystal grain boundary density can be made lower, the present inventors have repeatedly made extensive studies. As the result, they have discovered that the strength of Raman scattering caused by a crystal component of the silicon-based semiconductor layer (as a typical example, at 520 $cm^{-1}$ vicinity) may preferably be at least three times the strength of Raman scattering caused by its amorphous component (as a typical example, at 480 $cm^{-1}$ vicinity), and this is particularly preferable in a structure wherein the diffraction strength of (220)-plane is in a proportion of at least 50% of the total diffraction strength, because the above effect can be more promoted.

In order to form the film at a high rate, it is also effective to increase the applied electric power to decompose the source gas in a higher efficiency. Increasing the applied electric power, however, is considered to bring about the generation of excess ions simultaneously. Ions are accelerated by electrostatic force in a sheathed region, and hence it is considered that any excess ions may be an obstacle to the formation of high-quality silicon-based semiconductor layers, e.g., may cause distortion of crystal lattices as ion bombardment against deposited films or may cause voids made in the films, bringing about a bad influence that they lower the adhesion to underlying layer and the environmental resistance. Here, when plasma is taken place under conditions of a high pressure, it is considered that the ions in plasma have more opportunities to collide against other ions, active species and so forth, and this makes the ion bombardment less occur against the substrate and at the same time makes the reaction active which is caused by hydrogen radicals in the vicinity of the substrate surface. Stated specifically, the pressure at the time of film formation may be set at 6.67 Pa (50 mTorr) or higher. This is preferable because the ion bombardment can be made to less occur.

Component factors of the photovoltaic element of the present invention are described below. FIG. 1 is a schematic sectional view showing an example of the photovoltaic element of the present invention. In FIG. 1, reference numeral 101 denotes a substrate member; 102, a semiconductor layer; 103, a second transparent conductive layer; and 104, a collector electrode. Also, reference numeral 101-1 denotes a substrate; 101-2, a metal layer; and 101-3, a first transparent conductive layer. These constitute the substrate member 101, provided that the metal layer 101-2 and the first transparent conductive layer 101-3 are layers optionally provided, and are not essential.

(Substrate)

As the substrate 101-1, a plate-like member or sheet-like member comprised of metal, resin, glass, ceramic or semiconductor bulk may preferably be used. Its surface may have fine unevenness. A transparent substrate may also be used so that the light can enter on the substrate side. Also, the substrate may have the form of a continuous sheet so that films can continuously be formed by a roll-to-roll method. In particular, a material having a flexibility, such as stainless steel or polyimide, is preferable as the materials for the substrate 101-1.

(Metal Layer)

The metal layer 101-2 has function as an electrode and function as a reflective layer from which the light having reached the substrate 101-1 reflects so as to be again utilized in the semiconductor layer 102. As materials therefor, Al, Cu, Ag, Au, CuMg, AlSi and so forth may preferably be used. As methods for its formation, methods such as vacuum deposition, sputtering, electrodeposition and printing may preferably be used. The metal layer 101-2 may preferably have unevenness at its surface. This can make the reflected light have a larger optical-path length in the semiconductor layer 102 to make short-circuit current larger. Where the substrate 101-1 has a conductivity, the metal layer 101-2 need not be formed.

(First Transparent Conductive Layer)

The first transparent conductive layer 101-3 has the function to make the reflected light have a larger optical-path length in the semiconductor layer 102. It also has the function to cause the element of the metal layer 101-2 to diffuse or migrate to the semiconductor layer 102 to prevent the photovoltaic element from shunting. Where it has an appropriate resistance, it still also has the function to prevent the photovoltaic element from causing a short circuit due to any defects such as pinholes of the semiconductor layer. In addition, the first transparent conductive layer 101-3 may preferably have, like the metal layer 101-2, unevenness at its surface. The first transparent conductive layer 101-3 may preferably be formed of a conductive oxide such as ZnO or ITO (indium-tin oxide), and may preferably be formed by a method such as vacuum deposition, sputtering, CVD or electrodeposition. A substance which changes conductivity may also be added to such a conductive oxide.

Where a zinc oxide film is used as the first transparent conductive layer, as its formation method it may preferably be formed by a method such as sputtering or electrodeposition, or using these method in combination.

Conditions for forming the zinc oxide film by sputtering are greatly influenced by methods, types and flow rates of gases, internal pressure, electric power to be applied, film-forming rate, substrate temperature and so forth. For example, where the zinc oxide film is formed by DC magnetron sputtering and using a zinc oxide target, the types of gases may include Ar, Ne, Kr, Xe, Hg and $O_2$. The flow rates may differ depending on the size of apparatus and on evacuation rate, and may preferably be from 1 sccm to 10 sccm ($cm^3$/min) when, e.g., the film formation space has a volume of 20 liters. Also, the internal pressure at the time of film formation may preferably be from $1.33 \times 10^{-2}$ Pa ($1 \times 10^{-4}$ Torr) to 1.33 Pa (0.1 Torr). The electric power to be applied, which depends on the size of the target, may preferably be from 10 W to 100 kW when the target has a diameter of 15 cm. Also, the substrate temperature may differ in preferable ranges, depending on the film-forming rate, and may preferably be from 70° C. to 450° C. when films are formed at a rate of 1,000 nm/h.

As to conditions for forming the zinc oxide film by electrodeposition, an aqueous solution containing nitrate ions and zinc ions may preferably be used in a corrosion-resistant vessel. The nitrate ions and zinc ions may preferably be in a concentration ranging from 0.001 mol/L to 1.0 mol/L, more preferably ranging from 0.01 mol/L to 0.5 mol/L, and more preferably ranging from 0.1 mol/L to 0.25 mol/L. Feed sources of the nitrate ions and zinc ions may be, but not particularly limited to, zinc nitrate, which is a feed source for the both ions, or a mixture of a water soluble nitrate such as ammonium nitrate, which is a feed source for the nitrate ions, and a zinc salt such as zinc sulfate, which is a feed source for the zinc ions.

In order to control any abnormal growth or improve adhesion, it is also preferable to further add a carbohydrate to any of these aqueous solution. There are no particular limitations on the type of the carbohydrate, and usable are monosaccharides such as glucose (grape sugar) and fructose (fruit sugar), disaccharides such as maltose (malt sugar) and sucrose (cane sugar), polysaccharides such as dextrin and starch, and mixture of any of these.

The carbohydrate in the aqueous solution may preferably be in an amount ranging from 0.001 g/L to 300 g/L, more preferably ranging from 0.005 g/L to 100 g/L, and still more preferably ranging from 0.01 g/L to 60 g/L, which depends on the type of the carbohydrate. In the case when the zinc oxide film is formed by electrodeposition, in the aqueous solution the substrate on which the zinc oxide film is to be deposited is set as the cathode, and zinc, platinum, carbon or the like as the anode. Here, electric current which flows through a load resistor may preferably be at a density of from 10 mA/dm$^2$ to 10 A/dm$^2$.

By the method described above, the metal layer 101-2 and the first transparent conductive layer 101-3 are superposed on the substrate 101-1 to form the substrate member 101. In order to make the integration of the device easy, an insulating layer may also be provided as an intermediate layer in the substrate member 101.

(Semiconductor Layer)

As a method of forming the silicon-based semiconductor layer according to the present invention, a semiconductor layer superposed in the order of pin junction is described below. Without limitation thereto, the layer may also be, e.g., a semiconductor layer deposited in the order of nip junction or a multi-layer silicon-based semiconductor layer deposited in the order of nip/nip or pin/pin junctions.

As a chief material for the semiconductor layer 102 the silicon-based semiconductor layer of the present invention constitutes as part thereof, silicon (Si) of an amorphous phase or a crystal phase or of a mixed system of these is used. In place of silicon, an alloy of Si with carbon (C) or germanium (Ge) may be used. The semiconductor layer 102 is simultaneously incorporated with hydrogen and/or halogen atoms. The latter may be incorporated in an amount of from 0.1 to 40 atomic %. The semiconductor layer 102 may further contain oxygen, nitrogen and so forth. To form the semiconductor layer as a p-type semiconductor layer, a Group III element is incorporated, and to form it as an n-type semiconductor layer a Group V element. As electrical properties of the p-type layer and n-type layer, they may preferably be those having an activation energy of 0.2 eV or below, and most preferably 0.1 eV or below. As specific resistance, it may preferably be 100 Ω·cm or below, and most preferably 1 Ω·cm or below. In the case of a stacked cell (a photovoltaic element having a plurality of pin junctions), the i-type semiconductor layer in a pin junction close to the light-incident side may preferably have a broad band gap and have a band gap which is narrower in a farther pin junction.

It is suitable for a doped layer (p-type layer or n-type layer) on the light-incident side to be formed of a crystalline semiconductor less absorptive of light or a semiconductor having a broad band gap. As an example of a stacked cell in which two pin junctions have been superposed, it may include, as combination of i-type semiconductor layers, a cell having (amorphous silicon layer/semiconductor layer containing crystal phase) or (semiconductor layer containing crystal phase/semiconductor layer containing crystal phase) from the light-incident side.

As an example of a stacked cell in which three pin junctions have been superposed, it may include, as combination of i-type semiconductor layers, a cell having (amorphous silicon layer/amorphous silicon layer/ semiconductor layer containing crystal phase), (amorphous silicon layer/semiconductor layer containing crystal phase/ semiconductor layer containing crystal phase) or (semiconductor layer containing crystal phase/ semiconductor layer containing crystal phase/ semiconductor layer containing crystal phase) from the light-incident side. The i-type semiconductor layer may preferably have an absorptivity coefficient ($\alpha$) of light (630 nm) of 5,000 cm$^{-1}$ or higher, a light conductivity ($\sigma p$) of $10 \times 10^{-5}$ S/cm or above and a dark conductivity ($\sigma d$) of $10 \times 10^{-6}$ S/cm or below under irradiation by solar simulator light using a solar simulator (AM 1.5, 100 mW/cm$^2$), and an Urbach energy of 5 meV or below according to the constant photocurrent method (CPM). As the i-type semiconductor layer, a layer slightly made into p-type or n-type may also be used.

The semiconductor layer 102, a component factor of the present invention, is further additionally described below.

Figure 3:
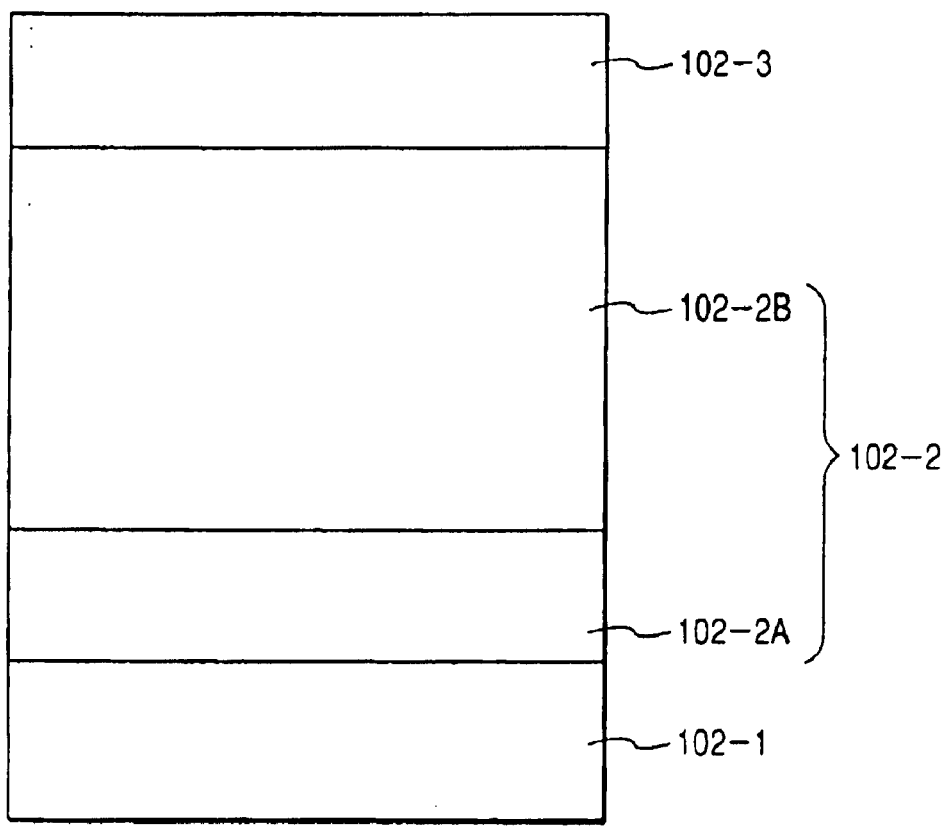
FIG. 3 is a schematic sectional view showing an example of the semiconductor layer of the present invention.

FIG. 3 is a schematic sectional view showing as a part of the photovoltaic element of the present invention a semiconductor layer 102 (102-1, 102-2A, 102-2B, 102-3) having a set of pin junction. In FIG. 1, reference numeral 102-1 denotes a semiconductor layer showing a first conductivity type and containing a crystal phase, on which an i-type semiconductor layer 102-2 comprising the silicon-based semiconductor layer of the present invention and containing a crystal phase and a non-single-crystal semiconductor layer 102-3 showing a second conductivity type are further superposed thereon. Also, the i-type semiconductor layer 102-2 containing a crystal phase consists of a first silicon-based semiconductor layer region 102-2A and a second silicon-based semiconductor layer region 102-2B. In the semiconductor layer having a plurality of pin junctions, at least one of them may preferably have the above construction. As another embodiment of the i-type semiconductor layer region 102-2 containing a crystal phase, it may be so constructed as to function substantially as an i-type semiconductor layer having a different form such as an amorphous silicon-based semiconductor layer region, in addition to the first silicon-based semiconductor layer region 102-2A and the second silicon-based semiconductor layer region 102-2B.

(Method of Forming Semiconductor Layer)

To form the semiconductor layer 102 (102-1, 102-2A, 102-2B, 102-3) having the silicon-based semiconductor layer of the present invention, the high-frequency plasma-assisted CVD is suited, provided that, in the present invention, plasma-assisted CVD making use of the source gas containing a silicon halide and hydrogen is used, where in a first step the first silicon-based semiconductor layer region 102-2A is formed using a source gas containing at least one of fluorine atoms and chlorine atoms as the above silicon halide, and in a second step the second silicon-based semiconductor layer region 102-2B is superposed on the first silicon-based semiconductor layer region by the high-frequency plasma-assisted CVD using a source gas containing hydrogen and a silicon compound such as $SiH_4$. Here, it is important for the second step to be kept under such conditions that the source gas used in the first step, containing at least one of fluorine atoms and chlorine atoms, is in a quantity smaller than that in the first step, or is not contained at all.

Thus, the feed of the source gas containing at least one of fluorine atoms and chlorine atoms is regulated in the first step and second step, whereby the silicon-based semiconductor layer having a high crystallizability and containing microcrystals can be formed at a high rate, i.e., both the quality and the productivity can be achieved at a high level.

A preferred example of the procedure to form the semiconductor layer 102 by the high-frequency plasma-assisted CVD is shown below.

(1) The inside of a semiconductor-forming vacuum vessel which can be brought into a vacuum is evacuated to a stated deposition pressure.

(2) Processing gases such as the source gas and a dilute gas are introduced into a deposition chamber, and the inside of the deposition chamber is evacuated by means of a vacuum pump, in the course of which the inside of the deposition chamber is set to a stated deposition pressure.

(3) The substrate member 101 is heated to a stated temperature by means of a heater.

(4) High-frequency power produced by a high-frequency power source is introduced into the deposition chamber. It may be introduced into the deposition chamber by a method in which, when the high-frequency power is microwave power, it is guided through a waveguide and is introduced into the deposition chamber via a dielectric window made of quartz, alumina, aluminum nitride or the like, or a method in which, when the high-frequency power is VHF or RF power, it is guided through a coaxial cable and is introduced into the deposition chamber via a metal electrode.

(5) Plasma is caused to take place in the deposition chamber to decompose the source gas to form a deposited film on the substrate member 101 placed in the deposition chamber. This procedure is optionally repeated a plurality of times to form the semiconductor layer 102.

The semiconductor layer 102 may be formed under conditions of a substrate temperature of from 100 to 450° C., a pressure of from 0.067 Pa (0.5 mTorr) to 1,333 Pa (10 Torr) and a high-frequency power density of $0.001^3$ (applied power/deposition chamber volume) in the deposition chamber, which are given as preferred conditions.

As source gases suited for the formation of the semiconductor layer 102 having the silicon-based semiconductor layer of the present invention, they may include gasifiable compounds containing silicon atoms, such as $SiH_4$ and $Si_2H_6$, and silicon halides such as $SiF_4$, $Si_2F_6$, $SiH_2F_2$, $SiH_2Cl_2$, $SiCl_4$ and $Si_2Cl_6$. Gases standing vaporized at room temperature are put in gas cylinders, and those standing liquefied are used after they have been bubbled with an inert gas. Where an alloy type layer is formed, a gasifiable compound containing Ge or C, such as $GeH_4$ or $CH_4$ may preferably further be added to the source gases. The source gases may preferably be introduced into the deposition chamber after they have each been diluted with a dilute gas. The dilute gas may include $H_2$ and He. A gasifiable compound containing nitrogen or oxygen may further be added as a source gas or a dilute gas. As a dopant gas for making the semiconductor layer into a p-type layer, $B_2H_6$, $BF_3$ or the like may be used. Also, as a dopant gas for making the semiconductor layer into an n-type layer, $PH_3$, $PF_3$ or the like may be used. In the case when the crystal phase semiconductor layer and the layer less absorptive of light or having a broad band gap are deposited, it is preferable that the dilute gas is used in a larger proportion with respect to the source gas and high-frequency power having a relatively high power density is introduced.

(Second Transparent Conductive Layer)

The second transparent conductive layer 103 serves as an electrode on the light-incident side, and also its layer thickness may appropriately be controlled so that it can also have the function of a reflection preventive layer. The second transparent conductive layer 103 is required to have a high transmittance in the wavelength region of the light the semiconductor layer 102 can absorb and have a low resistivity. It may preferably have a transmittance of 80% or higher, and more preferably 85% or higher, at 550 nm, and a resistivity of $5 \times 10^{-3}$ Ω·cm or lower, and more preferably $1 \times 10^{-3}$ Ω·cm or lower. As materials for the second transparent conductive layer 103, ITO, ZnO and $In_2O_3$ may preferably be used. As methods for its formation, methods such as vacuum deposition, CVD, spraying, spinning-on and dipping are preferred. A substance which changes conductivity may also be added to the above materials.

(Collector Electrode)

The collector electrode 104 is provided on the second transparent conductive layer 103 in order to improve electricity collection efficiency. It may be formed by a method in which a metal having an electrode pattern is formed by sputtering using a mask, a method in which a conductive paste or solder paste is printed, or a method in which a metal wire is fixed with a conductive paste; any of which is preferred.

A protective layer may also optionally be formed on each side of the photovoltaic element. At the same time, a reinforcing material such as a steel sheet may be used in combination, on the back (the side opposite to the light-incident side) of the photovoltaic element.

In the following examples, the present invention is described in greater detail taking the case of a solar cell as the photovoltaic element. These examples by no means limit the subject matter of the present invention.

EXAMPLE 1

Using a deposited-film forming apparatus 201 shown in FIG. 2, the silicon-based thin film was formed in the following way.

Figure 2:
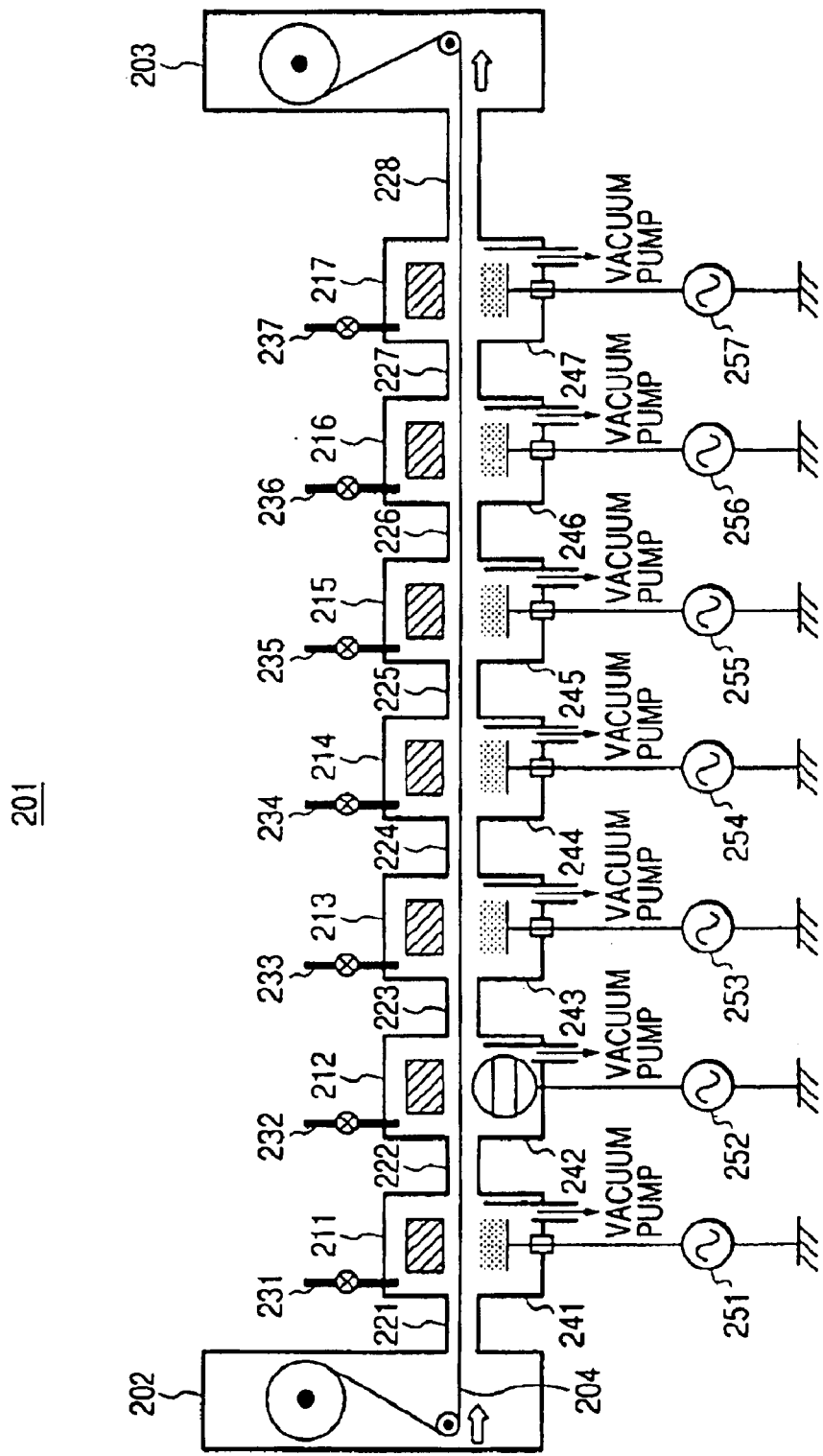
FIG. 2 is a schematic sectional view showing an example of the deposited film forming apparatus for producing the silicon-based semiconductor layer and the photovoltaic element of the present invention.

FIG. 2 is a schematic sectional view showing an example of a deposited-film forming apparatus for producing the silicon-based thin film and photovoltaic element of the present invention. The deposited-film forming apparatus 201 shown in FIG. 2 is constituted of a substrate wind-off container 202, semiconductor-forming vacuum vessels 211 to 217 and a substrate wind-up container 203, which are joined via gas gates 221 to 228. In this deposited-film forming apparatus 201, a belt-like conductive substrate 204 is so set as to extend through each vessel and each gas gate. The belt-like conductive substrate 204 is wound off from a bobbin provided in the substrate wind-off container 202, and is wound up on another bobbin in the substrate wind-up container 203.

The semiconductor-forming vacuum vessels 211 to 217 each have a deposition chamber. High-frequency power is applied from high-frequency power sources 251 to 257 to high-frequency power feed sections 241 to 247 in the respective deposition chambers, to cause glow discharge to take place, whereupon source gases are decomposed and semiconductor layers are deposited on the belt-like conductive substrate 204. Gas feed pipes 231 to 237 for feeding source gases and dilute gases are also connected to the semiconductor-forming vacuum vessels 211 to 217, respectively.

The deposited-film forming apparatus 201 shown in FIG. 2 has seven semiconductor-forming vacuum vessels. In the present and following examples, the glow discharge need not be caused to take place in all the semiconductor-forming vacuum vessels, and whether or not the glow discharge be taken place may be selected for each vessel in accordance with the layer construction of the photovoltaic element to be produced. Also, in each semiconductor-forming vacuum vessel, a film-forming region regulation plate (not shown) is provided in order to regulate the area of contact of the conductive substrate 204 with the discharge space in each deposition chamber so that the layer thickness of each semiconductor layer formed in each vessel can thereby be regulated.

First, a belt-like substrate (40 cm wide, 200 m long and 0.125 mm thick) made of stainless steel (SUS430BA) was well degreased and cleaned, and was set in a continuous sputtering apparatus (not shown), where, using an Ag electrode as a target, an Ag thin film of 100 nm thick was vacuum-deposited by sputtering. Using a ZnO target, a ZnO thin film of 1.2 $\mu$m thick was further vacuum-deposited on the Ag thin film by sputtering, thus the belt-like conductive substrate 204 was formed.

Next, a bobbin wound up with the belt-like conductive substrate 204 was set in the substrate wind-off container 202, and the conductive substrate 204 was passed through the bring-in side gas gate, the semiconductor-forming vacuum vessels 211, 212, 213, 214, 215, 216 and 217 and the bring-out side gas gate up to the substrate wind-up container 203. Its tension was regulated so that the belt-like conductive substrate 204 was not slack. Then, the insides of the substrate wind-off container 202, semiconductor-forming vacuum vessels 211, 212, 213, 214, 215, 216 and 217 and substrate wind-up container 203 were sufficiently evacuated to a vacuum of $6.7\times10^{-4}$ Pa ($5\times10^{-6}$ Torr) by means of an evacuation system consisting of vacuum pumps (not shown).

Next, while the evacuation system was operated, source gases and dilute gases were fed into the semiconductor-forming vacuum vessels 212 and 213 through the gas feed pipes 232 and 233, respectively.

200 cm$^3$/min (normal) of H$_2$ gas was also fed into the semiconductor-forming vacuum vessels other than the semiconductor-forming vacuum vessels 212 and 213 through the corresponding gas feed pipes, and 500 cm$^3$/min (normal) of H$_2$ gas was simultaneously fed as gate gas into the respective gas gates through their gate gas feed pipes (not shown). In this state, the evacuation capacity of the evacuation system was regulated to adjust the internal pressure of the semiconductor-forming vacuum vessels 212 and 213 to the desired pressure. Film-forming conditions were as shown in Table 1.

At the time the internal pressure of the semiconductor-forming vacuum vessels 212 and 213 became stable, the conductive substrate 204 was started to move from the substrate wind-off container 202 toward the substrate wind-up container 203.

Next, high-frequency power was applied from the high-frequency power sources 252 and 253 to the high-frequency power feed sections 242 and 243 in the semiconductor-forming vacuum vessels 212 and 213, respectively, to cause glow discharge to take place in the deposition chambers in the semiconductor-forming vacuum vessels 212 and 213. Thus, a first silicon-based thin-film region (layer thickness: 200 nm) and a second silicon-based thin-film region (layer thickness: 1.5 $\mu$m) were formed on the conductive substrate 204 to form a silicon-based thin film (Example 1).

Here, to the semiconductor-forming vacuum vessel 212, microwave power of 2.45 GHz in frequency and 50 mW/cm$^3$ in power density was guided through a waveguide and introduced into its deposition chamber through the high-frequency power feed section 242, formed of an alumina dielectric. To the semiconductor-forming vacuum vessel 213, VHF power of 100 MHz in frequency and 30 mw/cm$^3$ in power density was introduced into its deposition chamber through the high-frequency power feed section 243, formed of a metal electrode made of aluminum.

Next, a silicon-based thin film was formed in the same manner as in Example 1 except that the film-forming conditions for the first silicon-based thin-film region (layer thickness: 200 nm) were changed to the same conditions as those for the second silicon-based thin-film region except for the layer thickness (Comparative Example 1).

With regard to the silicon-based thin-films prepared in Example 1 and Comparative Example 1, their diffraction peaks were measured with an X-ray diffractometer by the use of CuK$\alpha$ rays to examine the proportion of diffraction strength of (220)-plane with respect to the total diffraction strength, and also to determine the Scherrer radius from half width of a diffraction peak of (220)-reflection. The Raman scattering spectra of the silicon-based thin-films prepared in Example 1 and Comparative Example 1 were also measured to examine the ratio of the strength of Raman scattering at 520 cm$^{-1}$ vicinity (caused by the crystal component) to that at 480 cm$^{-1}$ vicinity (caused by the amorphous component). The results of the above are shown in Table 2.

As can be seen from the foregoing, a silicon-based thin film having higher-grade crystallinity, crystallizability and orientation property and having a larger crystal grain size can be deposited under the conditions of Example 1 than under the conditions of Comparative Example 1, thus the method of forming the silicon-based thin-film according to the present invention has superior characteristic features.

EXAMPLE 2

Using the deposited-film forming apparatus 201 shown in FIG. 2, the silicon-based thin film was formed in the following way.

In the same manner as in Example 1, the belt-like conductive substrate 204 was prepared and set in the deposited-film forming apparatus 201, and the insides of the substrate wind-off container 202, semiconductor-forming vacuum vessels 211, 212, 213, 214, 215, 216 and 217 and substrate wind-up container 203 were sufficiently evacuated to a vacuum of $6.7\times10^{-4}$ Pa ($5\times10^{-6}$ Torr) by means of an evacuation system consisting of vacuum pumps (not shown).

Next, while the evacuation system was operated, source gases and dilute gases were fed into the semiconductor-forming vacuum vessels 212 and 213 through the gas feed pipes 232 and 233, respectively.

200 cm$^3$/min (normal) of H$_2$ gas was also fed into the semiconductor-forming vacuum vessels other than the semiconductor-forming vacuum vessels 212 and 213 through the corresponding gas feed pipes, and 500 cm³/min (normal) of H₂ gas was simultaneously fed as gate gas into the respective gas gates through their gate gas feed pipes (not shown). In this state, the evacuation capacity of the evacuation system was regulated to adjust the internal pressure of the semiconductor-forming vacuum vessels 212 and 213 to the desired pressure. Film-forming conditions were as shown in Table 3.

At the time the internal pressure of the semiconductor-forming vacuum vessels 212 and 213 became stable, the conductive substrate 204 was started to move from the substrate wind-off container 202 toward the substrate wind-up container 203.

Next, high-frequency power was applied from the high-frequency power sources 252 and 253 to the high-frequency power feed sections 242 and 243 in the semiconductor-forming vacuum vessels 212 and 213, respectively, to cause glow discharge to take place in the deposition chambers in the semiconductor-forming vacuum vessels 212 and 213. Thus, a first silicon-based thin-film region (layer thickness: 200 nm) and a second silicon-based thin-film region (layer thickness: 1.5 µm) were formed on the conductive substrate 204 to form a silicon-based thin film (Example 2). Here, to the semiconductor-forming vacuum vessel 212, microwave power of 2.45 GHz in frequency and 50 mW/cm³ in power density was guided through a waveguide and introduced into its deposition chamber through the high-frequency power feed section 242, formed of an alumina dielectric. To the semiconductor-forming vacuum vessel 213, VHF power of 100 MHz in frequency and 30 mW/cm³ in power density was introduced into its deposition chamber through the high-frequency power feed section 243, formed of a metal electrode made of aluminum.

With regard to the silicon-based thin-films prepared in Example 2 and Comparative Example 1, their diffraction peaks were measured with an X-ray diffractometer by the use of CuKα rays to examine the proportion of diffraction strength of (220)-plane with respect to the total diffraction strength, and also to determine the Scherrer radius from half width of a diffraction peak of (220)-reflection. The Raman scattering spectra of the silicon-based thin-films prepared in Example 2 and Comparative Example 1 were also measured to examine the ratio of the strength of Raman scattering at 520 cm⁻¹ vicinity (caused by the crystal component) to that at 480 cm⁻¹ vicinity (caused by the amorphous component). The results of the above are shown in Table 4.

As can be seen from the foregoing, a silicon-based thin film having higher-grade crystallinity, crystallizability and orientation property and having a larger crystal grain size can be deposited under the conditions of Example 2 than under the conditions of Comparative Example 1, thus the method of forming the silicon-based thin-film according to the present invention has superior characteristic features.

EXAMPLE 3

Figure 4:
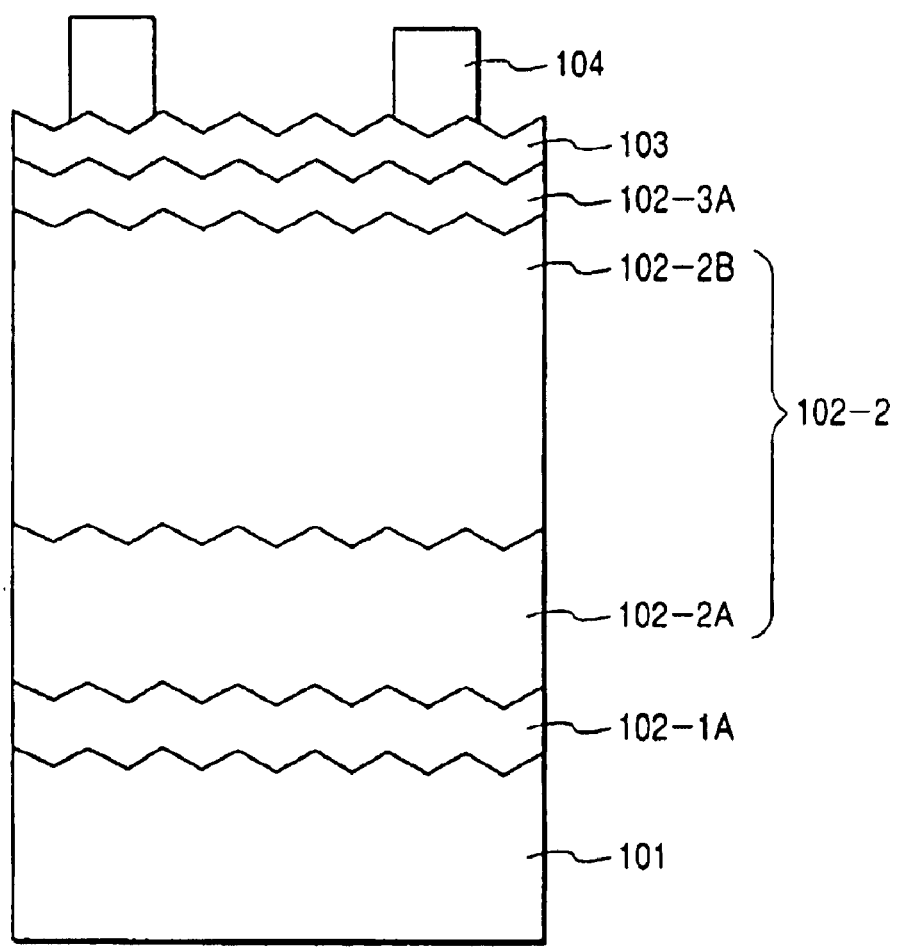
FIG. 4 is a schematic sectional view showing an example of the photovoltaic element including the silicon-based semiconductor layer of the present invention.

Using the deposited-film forming apparatus 201 shown in FIG. 2, a photovoltaic element shown in FIG. 4 was formed in the following way. FIG. 4 is a schematic sectional view showing an example of a photovoltaic element having the silicon-based thin-film of the present invention. In FIG. 4, the same members as those shown in FIG. 1 are denoted by the like reference numerals to avoid repeating the description. The semiconductor layer of this photovoltaic element consists of an amorphous n-type semiconductor layer 102-1A, an i-type semiconductor layer 102-2 containing a crystal phase, and a microcrystalline p-type semiconductor layer 102-3A. Also, the i-type semiconductor layer 102-2 containing a crystal phase consists of a first silicon-based thin-film region 102-2A and a second silicon-based thin-film region 102-2B. Namely, this photovoltaic element is what is called a p-i-n type single-cell photovoltaic element.

In the same manner as in Example 1, the belt-like conductive substrate 204 was prepared and set in the deposited-film forming apparatus 201, and the insides of the substrate wind-off container 202, semiconductor-forming vacuum vessels 211, 212, 213, 214, 215, 216 and 217 and substrate wind-up container 203 were sufficiently evacuated to a vacuum of 6.7×10⁻⁴ Pa (5×10⁻⁶ Torr) by means of an evacuation system consisting of vacuum pumps (not shown).

Next, while the evacuation system was operated, source gases and dilute gases were fed into the semiconductor-forming vacuum vessels 211, 212 213 and 214 through the gas feed pipes 231, 232, 233 and 234, respectively.

200 cm³/min (normal) of H₂ gas was also fed into the semiconductor-forming vacuum vessels other than the semiconductor-forming vacuum vessels 211, 212 213 and 214 through the corresponding gas feed pipes, and 500 cm³/min (normal) of H₂ gas was simultaneously fed as gate gas into the respective gas gates through their gate gas feed pipes (not shown). In this state, the evacuation capacity of the evacuation system was regulated to adjust the internal pressure of the semiconductor-forming vacuum vessels 211, 212 213 and 214 to the desired pressure. Film-forming conditions were as shown in Table 5.

At the time the internal pressure of the semiconductor-forming vacuum vessels 211, 212 213 and 214 became stable, the conductive substrate 204 was started to move from the substrate wind-off container 202 toward the substrate wind-up container 203.

Next, high-frequency power was applied from the high-frequency power sources 251 to 254 to the high-frequency power feed sections 241 to 244 in the semiconductor-forming vacuum vessels 211 to 214, respectively, to cause glow discharge to take place in the deposition chambers in the semiconductor-forming vacuum vessels 211 to 214. Thus, an amorphous n-type semiconductor layer (layer thickness: 30 nm), a first silicon-based thin-film region (layer thickness: 300 nm), a second silicon-based thin-film region (layer thickness: 2.0 µm) and a microcrystalline p-type semiconductor layer (layer thickness: 10 nm) were formed on the conductive substrate 204 to produce a photovoltaic element. Here, to the semiconductor-forming vacuum vessel 211, high-frequency power of 13.56 MHz in frequency and 5 mW/cm³ in power density was introduced into its deposition chamber through the high-frequency power feed section 241, formed of a metal electrode made of aluminum. To the semiconductor-forming vacuum vessel 212, high-frequency power of 2.45 GHz in frequency and 50 mW/cm³ in power density was guided through a waveguide and introduced into its deposition chamber through the high-frequency power feed section 242, formed of an alumina dielectric. To the semiconductor-forming vacuum vessel 213, high-frequency power of 100 MHz in frequency and 30 mW/cm³ in power density was introduced into its deposition chamber through the high-frequency power feed section 243, formed of a metal electrode made of aluminum. To the semiconductor-forming vacuum vessel 214, high-frequency power of 13.56 MHz in frequency and 30 mW/cm³ in power density was introduced into its deposition chamber through the high-frequency power feed section 244, formed of a metal electrode made of aluminum. Next, using a continuous module formation apparatus (not shown), the belt-like photovoltaic element thus formed was worked into solar-cell modules of 36 cm×22 cm each (Example 3).

Next, a p-i-n type single-cell photovoltaic element was produced in the same manner as in Example 3 except that the film-forming conditions for the first silicon-based thin-film region (layer thickness: 200 nm) were changed to the same conditions as those for the second silicon-based thin-film region except for the layer thickness. The photovoltaic element thus obtained was worked into solar-cell modules in the same manner as in Example 3 (Comparative Example 2).

Photoelectric conversion efficiency of the solar-cell modules produced in Example 3 and Comparative Example 2 was measured with a solar simulator (AM 1.5, 100 mW/cm$^2$). The photoelectric conversion efficiency of each solar-cell module of Example 3 being standardized as 1, the photoelectric conversion efficiency of each solar-cell module produced in Comparative Example 2 was in the value of 0.80.

The adhesion between the conductive substrate and the semiconductor layer was also examined by a cross cut tape test (distance between cuts: 1 mm; number of squares: about 100). Also, solar-cell modules whose initial photoelectric conversion efficiency was previously measured were set in a dark place having a temperature of 85° C. and a humidity of 85%, and were kept there for 30 minutes. Thereafter, these were cooled to a temperature of −20° C. taking 70 minutes and kept thereat for 30 minutes, and were again returned to the temperature of 85° C. and the humidity of 85% taking 70 minutes. This cycle was repeated 100 times, and thereafter the photoelectric conversion efficiency was again measured to examine any changes in photoelectric conversion efficiency caused by this temperature-humidity test. Also, the solar-cell modules whose initial photoelectric conversion efficiency was previously measured were kept at 50° C., in the state of which these were exposed to solar simulator light of AM 1.5 and 100 mW/cm$^2$ for 500 hours. Thereafter, their photoelectric conversion efficiency was again measured to examine any changes in photoelectric conversion efficiency caused by this photodegradation test. The results of these are shown in Table 6.

As can be seen from the foregoing, the solar-cell module having the photovoltaic element of the present invention has superior characteristic features.

EXAMPLE 4

Figure 5:
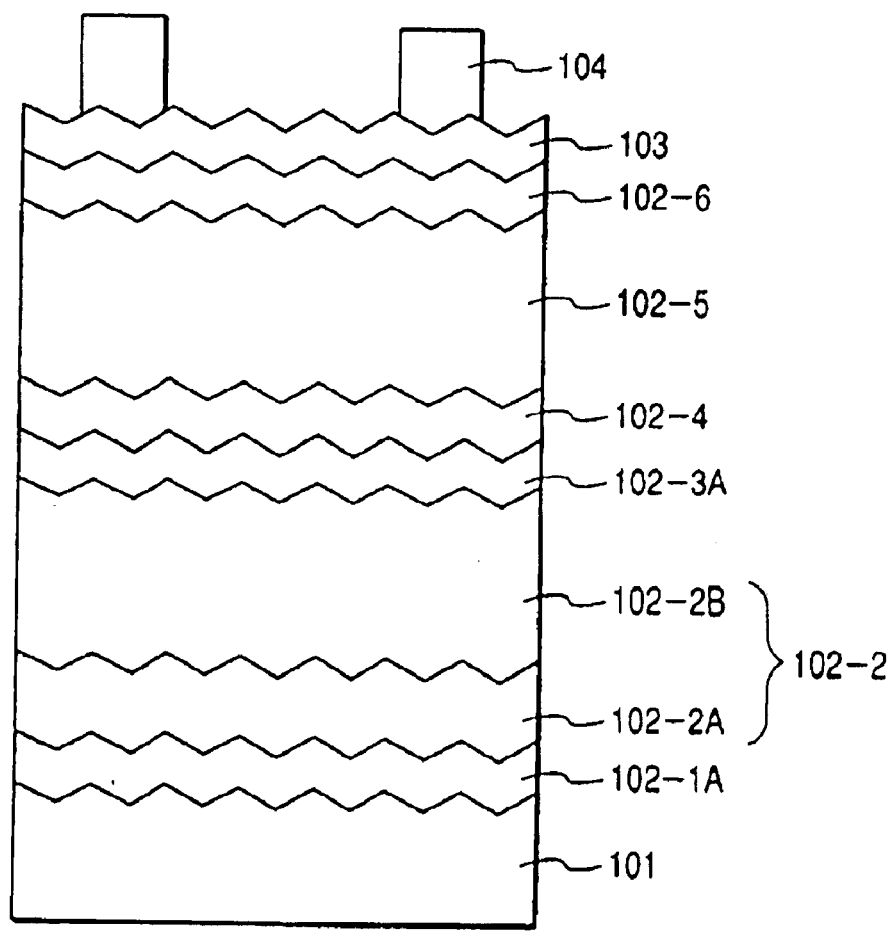
FIG. 5 is a schematic sectional view showing another example of the photovoltaic element including the silicon-based semiconductor layer of the present invention.

Using the deposited-film forming apparatus 201 shown in FIG. 2, a photovoltaic element shown in FIG. 5 was formed in the following way. FIG. 5 is a schematic sectional view showing an example of a photovoltaic element having the silicon-based thin-film of the present invention. In FIG. 5, the same members as those shown in FIG. 1 are denoted by the like reference numerals to avoid repeating the description. The semiconductor layer of this photovoltaic element consists of an amorphous n-type semiconductor layer 102-1A, an i-type semiconductor layer 102-2 containing a crystal phase, a microcrystalline p-type semiconductor layer 102-3A, an amorphous n-type semiconductor layer 102-4, an amorphous i-type semiconductor layer 102-5 and a microcrystalline p-type semiconductor layer 102-6. Also, the i-type semiconductor layer 102-2 containing a crystal phase consists of a first silicon-based thin-film region 102-2A and a second silicon-based thin-film region 102-2B. Namely, this photovoltaic element is what is called a p-i-n/p-i-n type double-cell photovoltaic element.

In the same manner as in Example 1, the belt-like conductive substrate 204 was prepared and set in the deposited-film forming apparatus 201, and the insides of the substrate wind-off container 202, semiconductor-forming vacuum vessels 211, 212, 213, 214, 215, 216 and 217 and substrate wind-up container 203 were sufficiently evacuated to a vacuum of 6.7×10$^{-4}$ Pa (5×10$^{-6}$ Torr) by means of an evacuation system consisting of vacuum pumps (not shown).

Next, while the evacuation system was operated, source gases and dilute gases were fed into the semiconductor-forming vacuum vessels 211 to 217 through the gas feed pipes 231 to 237, respectively.

500 cm$^3$/min (normal) of H$_2$ gas was also fed as gate gas into the respective gas gates through their gate gas feed pipes (not shown). In this state, the evacuation capacity of the evacuation system was regulated to adjust the internal pressure of the semiconductor-forming vacuum vessels 211 to 217 to the desired pressure. Film-forming conditions were as shown in Table 7 in respect of both the bottom cell and the top cell.

At the time the internal pressure of the semiconductor-forming vacuum vessels 211 to 217 became stable, the conductive substrate 204 was started to move from the substrate wind-off container 202 toward the substrate wind-up container 203.

Next, high-frequency power was applied from the high-frequency power sources 251 to 257 to the high-frequency power feed sections 241 to 247 in the semiconductor-forming vacuum vessels 211 to 217, respectively, to cause glow discharge to take place in the deposition chambers in the semiconductor-forming vacuum vessels 211 to 217. Thus, an amorphous n-type semiconductor layer (layer thickness: 30 nm), a first silicon-based thin-film region (layer thickness: 300 nm), a second silicon-based thin-film region (layer thickness: 2.0 μm) and a microcrystalline p-type semiconductor layer (layer thickness: 10 nm) were formed on the conductive substrate 204 to produce the bottom cell. Then, an amorphous n-type semiconductor layer (layer thickness: 30 nm), an amorphous i-type semiconductor layer (layer thickness: 0.5 μm) and a microcrystalline p-type semiconductor layer (layer thickness: 10 nm) were further formed to produce the top cell, thus the double-cell photovoltaic element was formed. Here, to the semiconductor-forming vacuum vessels 211 and 215, high-frequency power of 13.56 MHz in frequency and 5 mW/cm$^3$ in power density was introduced into their deposition chambers through the high-frequency power feed sections 241 and 245, respectively, each formed of a metal electrode made of aluminum. To the semiconductor-forming vacuum vessel 212, high-frequency power of 2.45 GHz in frequency and 50 mW/cm$^3$ in power density was guided through a waveguide and introduced into its deposition chamber through the high-frequency power feed section 242, formed of an alumina dielectric. To the semiconductor-forming vacuum vessel 213, high-frequency power of 100 MHz in frequency and 30 mW/cm$^3$ in power density was introduced into its deposition chamber through the high-frequency power feed section 243, formed of a metal electrode made of aluminum. To the semiconductor-forming vacuum vessels 214 and 217, high-frequency power of 13.56 MHz in frequency and 30 mW/cm$^3$ in power density was introduced into their deposition chambers through the high-frequency power feed sections 244 and 247, respectively, each formed of a metal electrode made of aluminum. To the semiconductor-forming vacuum vessel 216, high-frequency power of 13.56 MHz in frequency and 5 mW/cm$^3$ in power density was introduced into its deposition chamber through the high-frequency power feed section 245, formed of a metal electrode made of aluminum. Next, using a continuous module formation apparatus (not shown), the belt-like photovoltaic element thus formed was worked into solar-cell modules of 36 cm×22 cm each (Example 4).

Then, initial photoelectric conversion efficiency of the solar-cell modules of Example 4 was measured. Thereafter, the solar-cell modules were kept at 50° C., in the state of which these were continuously exposed to solar simulator light of AM 1.5 and 100 mW/cm$^2$, measuring their photoelectric conversion efficiency accordingly. As the result, the solar-cell modules of Example 4 showed photoelectric conversion efficiency of 1.1 times that of the solar-cell modules of Example 3, and also the solar-cell modules of Example 4 had superior adhesion and superior durability against the temperature-humidity test and photodegradation test.

As can be seen from the foregoing, the solar-cell module having the photovoltaic element of the present invention has superior characteristic features.

EXAMPLE 5

Using the deposited-film forming apparatus 201 shown in FIG. 2, the silicon-based thin film was formed in the following way.

In the same manner as in Example 1, the belt-like conductive substrate 204 was prepared and set in the deposited-film forming apparatus 201, and the insides of the substrate wind-off container 202, semiconductor-forming vacuum vessels 211, 212, 213, 214, 215, 216 and 217 and substrate wind-up container 203 were sufficiently evacuated to a vacuum of $6.7 \times 10^{-4}$ Pa ($5 \times 10^{-6}$ Torr) by means of an evacuation system consisting of vacuum pumps (not shown).

Next, while the evacuation system was operated, source gases and dilute gases were fed into the semiconductor-forming vacuum vessels 212 and 213 through the gas feed pipes 232 and 233, respectively.

200 cm$^3$/min (normal) of H$_2$ gas was also fed into the semiconductor-forming vacuum vessels other than the semiconductor-forming vacuum vessels 212 and 213 through the corresponding gas feed pipes, and 500 cm$^3$/min (normal) of H$_2$ gas was simultaneously fed as gate gas into the respective gas gates through their gate gas feed pipes (not shown). In this state, the evacuation capacity of the evacuation system was regulated to adjust the internal pressure of the semiconductor-forming vacuum vessels 212 and 213 to the desired pressure (pressure of Example 5-1). Film-forming conditions were as shown in Table 8.

At the time the internal pressure of the semiconductor-forming vacuum vessels 212 and 213 became stable, the conductive substrate 204 was started to move from the substrate wind-off container 202 toward the substrate wind-up container 203.

Next, high-frequency power was applied from the high-frequency power sources 252 and 253 to the high-frequency power feed sections 242 and 243 in the semiconductor-forming vacuum vessels 212 and 213, respectively, to cause glow discharge to take place in the deposition chambers in the semiconductor-forming vacuum vessels 212 and 213. Thus, a first silicon-based thin-film region (layer thickness: 200 nm) and a second silicon-based thin-film region (layer thickness: 1.5 µm) were formed on the conductive substrate 204 to form a silicon-based thin film (Example 5-1). Here, to the semiconductor-forming vacuum vessel 212, microwave power of 2.45 GHz in frequency and 50 mW/cm$^3$ in power density was guided through a waveguide and introduced into its deposition chamber through the high-frequency power feed section 242, formed of an alumina dielectric. To the semiconductor-forming vacuum vessel 213, VHF power of 100 MHz in frequency and 30 mW/cm$^3$ in power density was introduced into its deposition chamber through the high-frequency power feed section 243, formed of a metal electrode made of aluminum. Silicon-based thin-films were formed in the same way but changing the pressure as shown in Table 8 (Examples 5-2 and 5-3).

With regard to the silicon-based thin-films prepared in Examples 5-1, 5-2 and 5-3, their diffraction peaks were measured with an X-ray diffractometer by the use of CuKα rays to examine the proportion of diffraction strength of (220)-plane with respect to the total diffraction strength, and also to determine the Scherrer radius from half width of a diffraction peak of (220)-reflection. The Raman scattering spectra were also measured to examine the ratio of the strength of Raman scattering at 520 cm$^{-1}$ vicinity (caused by the crystal component) to that at 480 cm$^{-1}$ vicinity (caused by the amorphous component). The results of the above are shown in Table 9.

The silicon-based thin-films prepared in Examples 5-1, 5-2 and 5-3 had superior orientation property, crystal grain size and crystallizability. In particular, the silicon-based thin-films prepared in Examples 5-2 and 5-3 formed at a pressure of 6.7 Pa (50 mTorr) or above had especially superior characteristics.

EXAMPLE 6

Using a deposited-film forming apparatus 601 shown in FIG. 6, the silicon-based semiconductor layer was formed in the following way.

Figure 6:
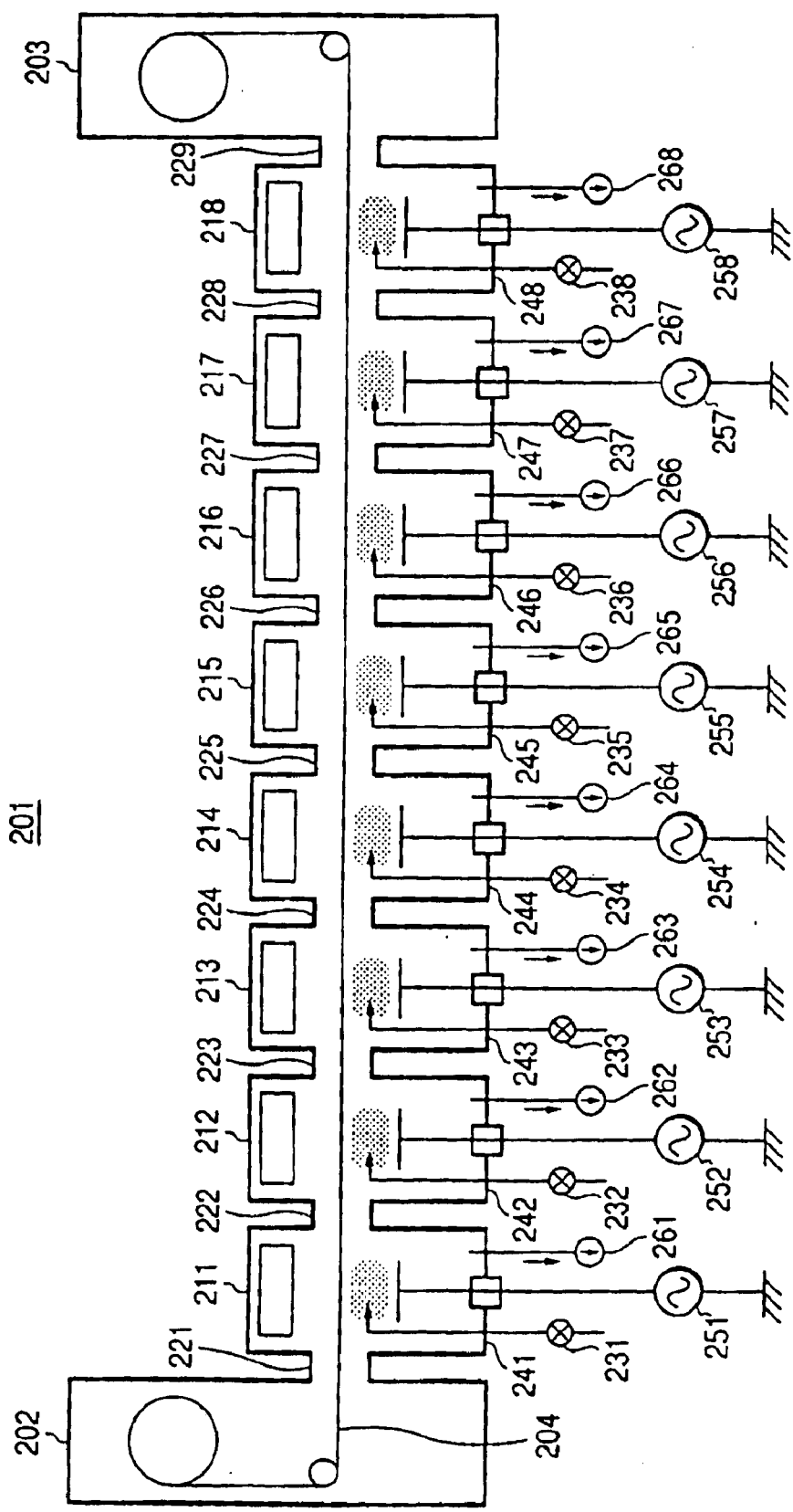
FIG. 6 is a schematic sectional view showing another example of the deposited film forming apparatus for producing the silicon-based semiconductor layer and the photovoltaic element of the present invention.

FIG. 6 is a schematic sectional view showing an example of a deposited-film forming apparatus for producing the silicon-based semiconductor layer and photovoltaic element of the present invention. The deposited-film forming apparatus 601 shown in FIG. 6 is constituted of a substrate wind-off container 202, semiconductor-forming vacuum vessels 211 to 218 and a substrate wind-up container 203, which are joined via gas gates 221 to 229. In this deposited-film forming apparatus 601, a belt-like conductive substrate 204 is so set as to extend through each vessel and each gas gate. The belt-like conductive substrate 204 is wound off from a bobbin provided in the substrate wind-off container 202, and is wound up on another bobbin in the substrate wind-up container 203.

The semiconductor-forming vacuum vessels 211 to 218 each have a deposition chamber. High-frequency power is applied from high-frequency power sources 251 to 258 to high-frequency power feed sections 241 to 248 in the respective deposition chambers, to cause glow discharge to take place, whereupon source gases are decomposed and semiconductor layers are deposited on the belt-like conductive substrate 204. Gas feed pipes 231 to 238 for feeding source gases and dilute gases are also connected to the semiconductor-forming vacuum vessels 211 to 218, respectively.

The deposited-film forming apparatus 601 shown in FIG. 6 has eight semiconductor-forming vacuum vessels. In the present and following examples, the glow discharge need not be caused to take place in all the semiconductor-forming vacuum vessels, and whether or not the glow discharge be taken place may be selected for each vessel in accordance with the layer construction of the photovoltaic element to be produced. Also, in each semiconductor-forming vacuum vessel, a film-forming region regulation plate (not shown) is provided in order to regulate the area of contact of the conductive substrate 204 with the discharge space in each deposition chamber so that the layer thickness of each semiconductor layer formed in each vessel can thereby be regulated.

First, a belt-like substrate (40 cm wide, 200 m long and 0.125 mm thick) made of stainless steel (SUS430 2D) was well degreased and cleaned, and was set in a continuous sputtering apparatus (not shown), where, using an Ag electrode as a target, an Ag film (metal layer) of 100 nm thick was vacuum-deposited by sputtering. Using a ZnO target, a ZnO film (transparent conductive layer) of 1,200 nm thick was further vacuum-deposited on the Ag film (metal layer) by sputtering, thus the belt-like conductive substrate 204 was formed.

Next, a bobbin wound up with the belt-like conductive substrate 204 was set in the substrate wind-off container 202, and the conductive substrate 204 was passed through the bring-in side gas gate, the semiconductor-forming vacuum vessels 211, 212, 213, 214, 215, 216, 217 and 218 and the bring-out side gas gate up to the substrate wind-up container 203. Its tension was regulated so that the belt-like conductive substrate 204 was not slack. Then, the insides of the substrate wind-off container 202, semiconductor-forming vacuum vessels 211, 212, 213, 214, 215, 216, 217 and 218 and substrate wind-up container 203 were sufficiently evacuated to a vacuum of 6.7×1–4 Pa (5×10$^{-6}$ Torr) by means of an evacuation system consisting of vacuum pumps 261, 262, 263, 264, 265, 266, 267 and 268.

Next, 3,000 cm$^3$/min (normal) of H$_2$ gas, 500 cm$^3$/min (normal) of SiF$_4$ and 150 cm$^3$/min (normal) of SiH$_4$ were fed into the semiconductor-forming vacuum vessel 212 through the gas feed pipe 232.

Next, while the evacuation system was operated, 3,000 cm$^3$/min (normal) of H$_2$ gas and 375 cm$^3$/min (normal) of SiH$_4$ were fed into the semiconductor-forming vacuum vessel 213 through the gas feed pipe 233.

500 cm$^3$/min (normal) of H$_2$ gas was also fed into the semiconductor-forming vacuum vessels other than the semiconductor-forming vacuum vessels 212 and 213 through the corresponding gas feed pipes, and 1,000 sccm of H$_2$ gas was simultaneously fed as gate gas into the respective gas gates through their gate gas feed pipes (not shown). In this state, the evacuation capacity of the evacuation system was regulated to adjust the internal pressure of the semiconductor-forming vacuum vessels 212 and 213 to the desired pressure. Film-forming conditions were as shown in Table 10.

At the time the internal pressure of the semiconductor-forming vacuum vessels 212 and 213 became stable, the conductive substrate 204 was started to move from the substrate wind-off container 202 toward the substrate wind-up container 203.

Next, to the high-frequency power feed sections 242 and 243 in the semiconductor-forming vacuum vessels 212 and 213, VHF power of 50 MHz in frequency and 18 mW/cm$^3$ in power density was introduced into their deposition chambers through the high-frequency power feed sections 242 and 243, respectively, each formed of a metal electrode made of aluminum, to cause glow discharge to take place in the deposition chambers in the semiconductor-forming vacuum vessels 212 and 213. Thus, a first silicon-based semiconductor layer region (layer thickness: 200 nm) and a second silicon-based semiconductor layer region (layer thickness: 1,500 nm) were formed on the conductive substrate 204 to form a silicon-based semiconductor layer.

Comparative Example 3

Here, 3,000 cm$^3$/min (normal) of H$_2$ gas and 375 cm$^3$/min (normal) of SiH$_4$ were fed into the semiconductor-forming vacuum vessel 212 through the gas feed pipe 232.

Next, 3,000 cm$^3$/min (normal) of H$_2$ gas, 500 cm$^3$/min (normal) of SiF$_4$ and 150 cm$^3$/min (normal) of SiH$_4$ were fed into the semiconductor-forming vacuum vessel 213 through the gas feed pipe 233.

Then, to the high-frequency power feed sections 242 and 243 in the semiconductor-forming vacuum vessels 212 and 213, VHF power of 60 MHz in frequency and 18 mW/cm$^3$ in power density was introduced into their deposition chambers through the high-frequency power feed sections 242 and 243, respectively, each formed of a metal electrode made of aluminum, to cause glow discharge to take place in the deposition chambers in the semiconductor-forming vacuum vessels 212 and 213. Thus, a first silicon-based semiconductor layer region (layer thickness: 200 nm) and a second silicon-based semiconductor layer region (layer thickness: 1,500 nm) were formed on the conductive substrate 204 to form a silicon-based semiconductor layer. In this way, the silicon-based semiconductor layer was formed in the same manner as in Example 6 except that the film-forming conditions for the first silicon-based semiconductor layer region and the film-forming conditions for the second silicon-based semiconductor layer region were exchanged.

With regard to the silicon-based semiconductor layers prepared in Example 6 and Comparative Example 3, their diffraction peaks were measured with an X-ray diffractometer by the use of CuKα rays to examine the proportion of diffraction strength of (220)-plane with respect to the total diffraction strength, and also to determine the Scherrer radius from half width of a diffraction peak of (220)-reflection. The Raman scattering spectra of the silicon-based semiconductor layers prepared in Example 6 and Comparative Example 3 were also measured to examine the ratio of the strength of Raman scattering at 520 cm$^{-1}$ vicinity (caused by the crystal component) to that at 480 cm$^{-1}$ vicinity (caused by the amorphous component). The results of the above are shown in Table 11.

From the foregoing, it is considered that, under the conditions of Example 6, compared with the conditions of Comparative Example 3, nuclei of Si are formed in the first silicon-based semiconductor layer region on account of the plasma discharge taken place in the atmosphere containing fluorine atoms, and are grown in the second silicon-based semiconductor layer region. As the result, a silicon-based semiconductor layer having higher-grade crystallinity, crystallizability and orientation property and having a larger crystal grain size can be deposited, thus the method of forming the silicon-based semiconductor layer according to the present invention is seen to have superior characteristic features.

EXAMPLE 7

Using the deposited-film forming apparatus 601 shown in FIG. 6, the silicon-based semiconductor layer was formed in the following way.

In the same manner as in Example 6, the belt-like conductive substrate 204 was prepared and set in the deposited-film forming apparatus 601, and the insides of the substrate wind-off container 202, semiconductor-forming vacuum vessels 211, 212, 213, 214, 215, 216, 217 and 218 and substrate wind-up container 203 were sufficiently evacuated to a vacuum of 6.7×10⁻⁴ Pa (5×10⁻⁶ Torr) by means of an evacuation system consisting of vacuum pumps 261 to 268.

Next, 3,000 cm³/min (normal) of H$_2$ gas, 500 cm³/min (normal) of SiF$_4$ and 150 cm³/min (normal) of SiH$_4$ were fed into the semiconductor-forming vacuum vessel 212 through the gas feed pipe 232.

Next, 3,000 cm³/min (normal) of H$_2$ gas, 100 cm³/min (normal) of SiF$_4$ and 150 cm³/min (normal) of SiH$_4$ were fed into the semiconductor-forming vacuum vessel 213 through the gas feed pipe 233.

500 cm³/min (normal) of H$_2$ gas was also fed into the semiconductor-forming vacuum vessels other than the semiconductor-forming vacuum vessels 212 and 213 through the corresponding gas feed pipes, and 1,000 cm³/min (normal) of H$_2$ gas was simultaneously fed as gate gas into the respective gas gates. In this state, the evacuation capacity of the evacuation system was regulated to adjust the internal pressure of the semiconductor-forming vacuum vessels 212 and 213 to the desired pressure. Film-forming conditions were as shown in Table 12.

At the time the internal pressure of the semiconductor-forming vacuum vessels 212 and 213 became stable, the conductive substrate 204 was started to move from the substrate wind-off container 202 toward the substrate wind-up container 203.

Next, high-frequency power was applied from the high-frequency power sources 252 and 253 to the high-frequency power feed sections 242 and 243 in the semiconductor-forming vacuum vessels 212 and 213, respectively, to cause glow discharge to take place in the deposition chambers in the semiconductor-forming vacuum vessels 212 and 213. Thus, a first silicon-based semiconductor layer region (layer thickness: 200 nm) and a second silicon-based semiconductor layer region (layer thickness: 1.5 μm) were formed on the conductive substrate 204 to form a silicon-based semiconductor layer.

In this way, the silicon-based semiconductor layer was formed in the same manner as in Example 6 except that 100 cm³/min (normal) of SiF$_4$ was additionally fed when the second silicon-based semiconductor layer region is formed and that the SiF$_4$ in the second silicon-based semiconductor layer region was fed in a quantity smaller than that in the first silicon-based semiconductor layer region.

With regard to the silicon-based semiconductor layer prepared in Example 7, its diffraction peak was measured with an X-ray diffractometer by the use of CuKα rays to examine the proportion of diffraction strength of (220)-plane with respect to the total diffraction strength, and also to determine the Scherrer radius from half width of a diffraction peak of (220)-reflection. The Raman scattering spectra of the silicon-based semiconductor layer prepared in Example 7 were also measured to examine the ratio of the strength of Raman scattering at 520 cm⁻¹ vicinity (caused by the crystal component) to that at 480 cm⁻¹ vicinity (caused by the amorphous component). The results of the above and the results of comparison with Example 6 are shown in Table 13.

As can be seen from the results shown in Table 13, compared with the results of Example 6, substantially the same results are obtained in Example 7, and superior characteristics can be attained by the method of forming the silicon-based semiconductor layer according to the present invention in which the quantity of the SiF$_4$ contained in the second silicon-based semiconductor layer region is made smaller than that of the first silicon-based semiconductor layer region.

EXAMPLE 8

Using the deposited-film forming apparatus 601 shown in FIG. 6, the silicon-based semiconductor layer was formed in the following way.

In the same manner as in Example 6, the belt-like conductive substrate 204 was prepared and set in the deposited-film forming apparatus 601, and the insides of the substrate wind-off container 202, semiconductor-forming vacuum vessels 211, 212, 213, 214, 215, 216, 217 and 218 and substrate wind-up container 203 were sufficiently evacuated to a vacuum of 6.7×10⁻⁴ Pa (5×10⁻⁶ Torr) by means of an evacuation system consisting of vacuum pumps 261 to 268.

Next, 3,000 cm³/min (normal) of H$_2$ gas and 450 cm³/min (normal) of SiCl$_2$H$_2$ were fed into the semiconductor-forming vacuum vessel 212 through the gas feed pipe 232.

Next, 3,000 cm³/min (normal) of H$_2$ gas and 375 cm³/min (normal) of SiH$_4$ were fed into the semiconductor-forming vacuum vessel 213 through the gas feed pipe 233.

200 cm³/min (normal) of H$_2$ gas was also fed into the semiconductor-forming vacuum vessels other than the semiconductor-forming vacuum vessels 212 and 213 through the corresponding gas feed pipes, and 500 cm³/min (normal) of H$_2$ gas was simultaneously fed as gate gas into the respective gas gates through their gate gas feed pipes (not shown). In this state, the evacuation capacity of the evacuation system was regulated to adjust the internal pressure of the semiconductor-forming vacuum vessels 212 and 213 to the desired pressure. Film-forming conditions were as shown in Table 14.

At the time the internal pressure of the semiconductor-forming vacuum vessels 212 and 213 became stable, the conductive substrate 204 was started to move from the substrate wind-off container 202 toward the substrate wind-up container 203.

Next, high-frequency power was applied from the high-frequency power sources 252 and 253 to the high-frequency power feed sections 242 and 243 in the semiconductor-forming vacuum vessels 212 and 213, respectively, to cause glow discharge to take place in the deposition chambers in the semiconductor-forming vacuum vessels 212 and 213. Thus, a first silicon-based semiconductor layer region (layer thickness: 200 nm) and a second silicon-based semiconductor layer region (layer thickness: 1.5 μm) were formed on the conductive substrate 204 to form a silicon-based semiconductor layer.

In this way, the silicon-based semiconductor layer was formed in the same manner as in Example 6 except that 450 cm³/min (normal) of SiCl$_2$H$_2$ was fed when the second silicon-based semiconductor layer region is formed.

Comparative Example 4

Here, while the evacuation system was operated, source gas and dilute gas were fed into the semiconductor-forming vacuum vessel 212 through the gas feed pipes 232. Comparative Example 4 was carried out in the same manner as in Example 8 provided that 450 cm³/min (normal) of SiCl$_2$H$_2$ in the formation condition of 212 of Example 8 was changed to 450 cm³/min (normal) of SiH$_4$.

Then, to the high-frequency power feed sections 242 and 243 in the semiconductor-forming vacuum vessels 212 and 213, VHF power of 60 MHz in frequency and 18 mW/cm³ in power density was introduced into their deposition chambers through the high-frequency power feed sections 242 and 243, respectively, each formed of a metal electrode made of aluminum, to cause glow discharge to take place in the deposition chambers in the semiconductor-forming vacuum vessels 212 and 213. Thus, a first silicon-based semiconductor layer region (layer thickness: 200 nm) and a second silicon-based semiconductor layer region (layer thickness: 1,500 nm) were formed on the conductive substrate 204 to form a silicon-based semiconductor layer.

In this way, the silicon-based semiconductor layer was formed in the same manner as in Example 8 except that, as the film-forming conditions for the first and second silicon-based semiconductor layer regions, a source gas not containing fluorine atoms or chlorine atoms was used.

With regard to the silicon-based semiconductor layers prepared in Example 8 and Comparative Example 4, their diffraction peaks were measured with an X-ray diffractometer by the use of CuKα rays to examine the proportion of diffraction strength of (220)-plane with respect to the total diffraction strength, and also to determine the Scherrer radius from half width of a diffraction peak of (220)-reflection. The Raman scattering spectra of the silicon-based semiconductor layers prepared in Example 8 and Comparative Example 4 were also measured to examine the ratio of the strength of Raman scattering at 520 $cm^{-1}$ vicinity (caused by the crystal component) to that at 480 $cm^{-1}$ vicinity (caused by the amorphous component). The results of the above are shown in Table 15.

From the foregoing, it can be understood that the method of forming the silicon-based semiconductor layer according to the present invention has excellent features.

Namely, from Examples 6, 7 and 8, it can be said to be important that the nuclei of Si are formed in the first silicon-based semiconductor layer region on account of the plasma discharge taken place in the atmosphere containing fluorine atoms or chlorine atoms of the silicon fluoride.

EXAMPLE 9

Using the deposited-film forming apparatus 601 shown in FIG. 6, a photovoltaic element shown in FIG. 4 was formed in the following way. FIG. 4 is a schematic sectional view showing an example of a photovoltaic element having the silicon-based semiconductor layer of the present invention. In FIG. 4, the same members as those shown in FIG. 1 are denoted by the like reference numerals to avoid repeating the description. The semiconductor layer of this photovoltaic element consists of an amorphous n-type semiconductor layer 102-1A, an i-type semiconductor layer 102-2 containing a crystal phase, and a microcrystalline p-type semiconductor layer 102-3A. Also, the i-type semiconductor layer 102-2 containing a crystal phase consists of a first silicon-based semiconductor layer region 102-2A and a second silicon-based semiconductor layer region 102-2B. Namely, this photovoltaic element is what is called a p-i-n type single-cell photovoltaic element.

In the same manner as in Example 6, the belt-like conductive substrate 204 was prepared and set in the deposited-film forming apparatus 601, and the insides of the substrate wind-off container 202, semiconductor-forming vacuum vessels 211, 212, 213, 214, 215, 216, 217 and 218 and substrate wind-up container 203 were sufficiently evacuated to a vacuum of $6.7 \times 10^{-4}$ Pa ($5 \times 10^{-6}$ Torr) by means of an evacuation system consisting of vacuum pumps 261 to 268.

Next, while the evacuation system was operated, 3,000 $cm^3$/min (normal) of $H_2$ gas, 500 $cm^3$/min (normal) of $SiF_4$ and 150 $cm^3$/min (normal) of $SiH_4$ were fed into the semiconductor-forming vacuum vessel 212 through the gas feed pipe 232.

Next, while the evacuation system was operated, source gases and dilute gases were fed into the semiconductor-forming vacuum vessels 211, 213 and 214 through the gas feed pipes 231, 233 and 234, respectively.

500 $cm^3$/min (normal) of $H_2$ gas was also fed into the semiconductor-forming vacuum vessels other than the semiconductor-forming vacuum vessels 211, 212, 213 and 214 through the corresponding gas feed pipes, and 1,000 $cm^3$/min (normal) of $H_2$ gas was simultaneously fed as gate gas into the respective gas gates through their gate gas feed pipes (not shown). In this state, the evacuation capacity of the evacuation system was regulated to adjust the internal pressure of the semiconductor-forming vacuum vessels 211, 212 213 and 214 to the desired pressure. Film-forming conditions were as shown in Table 16.

At the time the internal pressure of the semiconductor-forming vacuum vessels 211, 212 213 and 214 became stable, the conductive substrate 204 was started to move from the substrate wind-off container 202 toward the substrate wind-up container 203.

Next, high-frequency power was applied from the high-frequency power sources 251 to 254 to the high-frequency power feed sections 241 to 244 in the semiconductor-forming vacuum vessels 211 to 214, respectively, to cause glow discharge to take place in the deposition chambers in the semiconductor-forming vacuum vessels 211 to 214. Thus, an amorphous n-type semiconductor layer (layer thickness: 30 nm), a first silicon-based semiconductor layer region (layer thickness: 300 nm), a second silicon-based semiconductor layer region (layer thickness: 2,000 nm) and a microcrystalline p-type semiconductor layer (layer thickness: 10 nm) were formed on the conductive substrate 204 to produce a photovoltaic element. Here, to the semiconductor-forming vacuum vessel 211, high-frequency power of 13.56 MHz in frequency and 5 $mW/cm^3$ in power density was introduced into its deposition chamber through the high-frequency power feed section 241, formed of a metal electrode made of aluminum. To the semiconductor-forming vacuum vessels 212 and 213, high-frequency power of 60 MHz in frequency and 18 $mW/cm^3$ in power density was introduced into its deposition chamber through the high-frequency power feed sections 242 and 243, respectively, each formed of a metal electrode made of aluminum. To the semiconductor-forming vacuum vessel 214, high-frequency power of 13.56 MHz in frequency and 30 $mW/cm^3$ in power density was introduced into its deposition chamber through the high-frequency power feed section 244, formed of a metal electrode made of aluminum. Next, using a continuous module formation apparatus (not shown), the belt-like photovoltaic element thus formed was worked into solar-cell modules of 36 cm×22 cm each.

Comparative Example 5

Here, while the evacuation system was operated, source gas and dilute gas were fed into the semiconductor-forming vacuum vessel 212 through the gas feed pipes 232. Comparative Example 5 was carried out in the same manner as in Example 9 provided that the formation conditions of 212 and 213 were exchanged to each other.

Specifically, 3,000 $cm^3$/min (normal) of $H_2$ gas and 375 $cm^3$/min (normal) of $SiH_4$ were fed into the semiconductor-forming vacuum vessel 212 through the gas feed pipe 232.

Next, 3,000 $cm^3$/min (normal) of $H_2$ gas, 500 $cm^3$/min (normal) of $SiF_4$ and 150 $cm^3$/min (normal) of $SiH_4$ were fed into the semiconductor-forming vacuum vessel 213 through the gas feed pipe 233.

Then, to the high-frequency power feed sections 242 and 243 in the semiconductor-forming vacuum vessels 212 and 213, VHF power of 60 MHz in frequency and 18 mW/cm$^3$ in power density was introduced into their deposition chambers through the high-frequency power feed sections 242 and 243, respectively, each formed of a metal electrode made of aluminum, to cause glow discharge to take place in the deposition chambers in the semiconductor-forming vacuum vessels 212 and 213. Thus, a first silicon-based semiconductor layer region (layer thickness: 2,000 nm) and a second silicon-based semiconductor layer region (layer thickness: 300 nm) were formed on the conductive substrate 204 to form a silicon-based semiconductor layer. A photovoltaic element was prepared and solar-cell modules were obtained in the same manner as in Example 9 except for the foregoing.

In this way, the photovoltaic element was worked into solar-cell modules in the same manner as in Example 6 except that, to form the silicon-based semiconductor layer, the film-forming conditions for the first silicon-based semiconductor layer region and the film-forming conditions for the second silicon-based semiconductor layer region were exchanged.

Photoelectric conversion efficiency of the solar-cell modules produced in Example 9 and Comparative Example 5 was measured with a solar simulator (AM 1.5, 100 mW/cm$^2$). The photoelectric conversion efficiency of each solar-cell module of Example 9 being standardized as 1, the photoelectric conversion efficiency of each solar-cell module produced in Comparative Example 5 was in the value of 0.70.

The adhesion between the conductive substrate and the semiconductor layer was also examined by a cross cut tape test (distance between cuts: 1 mm; number of squares: about 100). Also, solar-cell modules whose initial photoelectric conversion efficiency was previously measured were set in a dark place having a temperature of 85° C. and a humidity of 85%, and were kept there for 30 minutes. Thereafter, these were cooled to a temperature of −20° C. taking 70 minutes and kept thereat for 30 minutes, and were again returned to the temperature of 85° C. and the humidity of 85% taking 70 minutes. This cycle was repeated 100 times, and thereafter the photoelectric conversion efficiency was again measured to examine any changes in photoelectric conversion efficiency caused by this temperature-humidity test. Also, the solar-cell modules whose initial photoelectric conversion efficiency was previously measured were kept at 50° C., in the state of which these were exposed to solar simulator light of AM 1.5 and 100 mW/cm$^2$ for 500 hours. Thereafter, their photoelectric conversion efficiency was again measured to examine any changes in photoelectric conversion efficiency caused by this photodegradation test. The results of these are shown in Table 17.

As can be seen from the foregoing, the solar-cell module having the photovoltaic element of the present invention has superior characteristic features.

EXAMPLE 10

Using the deposited-film forming apparatus 601 shown in FIG. 6 a photovoltaic element shown in FIG. 5 was formed in the following way. FIG. 5 is a schematic sectional view showing an example of a photovoltaic element having the silicon-based semiconductor layer of the present invention. In FIG. 5, the same members as those shown in FIG. 1 are denoted by the like reference numerals to avoid repeating the description. The semiconductor layer of this photovoltaic element consists of an amorphous n-type semiconductor layer 102-1A, an i-type semiconductor layer 102-2 containing a crystal phase, a microcrystalline p-type semiconductor layer 102-3A, an amorphous n-type semiconductor layer 102-4, an amorphous i-type semiconductor layer 102-5 and a microcrystalline p-type semiconductor layer 102-6. Also, the i-type semiconductor layer 102-2 containing a crystal phase consists of a first silicon-based semiconductor layer region 102-2A and a second silicon-based semiconductor layer region 102-2B. Namely, this photovoltaic element is what is called a p-i-n/p-i-n type double-cell photovoltaic element.

In the same manner as in Example 6, the belt-like conductive substrate 204 was prepared and set in the deposited-film forming apparatus 601, and the insides of the substrate wind-off container 202, semiconductor-forming vacuum vessels 211, 212, 213, 214, 215, 216, 217 and 218 and substrate wind-up container 203 were sufficiently evacuated to a vacuum of 6.7×10$^{-4}$ Pa (5×10$^{-6}$ Torr) by means of an evacuation system consisting of vacuum pumps 261, 262, 263, 264, 265, 266, 267 and 268.

Next, while the evacuation system was operated, source gases and dilute gases were fed into the semiconductor-forming vacuum vessels 211 to 218 through the gas feed pipes 231 to 238, respectively.

1,000 cm$^3$/min (normal) of H$_2$ gas was also fed as gate gas into the respective gas gates through their gate gas feed pipes (not shown). In this state, the evacuation capacity of the evacuation system was regulated to adjust the internal pressure of the semiconductor-forming vacuum vessels 211 to 218 to the desired pressure. Film-forming conditions were as shown in Table 18 in respect of both the bottom cell and the top cell.

At the time the internal pressure of the semiconductor-forming vacuum vessels 211 to 218 became stable, the conductive substrate 204 was started to move from the substrate wind-off container 202 toward the substrate wind-up container 203.

Next, high-frequency power was applied from the high-frequency power sources 251 to 258 to the high-frequency power feed sections 241 to 248 in the semiconductor-forming vacuum vessels 211 to 218, respectively, to cause glow discharge to take place in the deposition chambers in the semiconductor-forming vacuum vessels 211 to 218. Thus, an amorphous n-type semiconductor layer (layer thickness: 30 nm), a first silicon-based semiconductor layer region (layer thickness: 300 nm), a second silicon-based semiconductor layer region (layer thickness: 2,000 nm) and a microcrystalline p-type semiconductor layer (layer thickness: 10 nm) were formed on the conductive substrate 204 to produce the bottom cell. Then, an amorphous n-type semiconductor layer (layer thickness: 30 nm), an amorphous i-type semiconductor layer (layer thickness: 500 nm) and a microcrystalline p-type semiconductor layer (layer thickness: 10 nm) were further formed to produce the top cell, thus the double-cell photovoltaic element was formed. Here, to the semiconductor-forming vacuum vessels 211 and 215, high-frequency power of 13.56 MHz in frequency and 5 mW/cm$^3$ in power density was introduced into their deposition chambers through the high-frequency power feed sections 241 and 245, respectively, each formed of a metal electrode made of aluminum. To the semiconductor-forming vacuum vessels 212 and 213, high-frequency power of 50 MHz in frequency and 18 mw/cm$^3$ in power density was introduced into into their deposition chambers through the high-frequency power feed sections 242 and 243, respectively, each formed of a metal electrode made of aluminum. To the semiconductor-forming vacuum vessels 214 and 217, high-frequency power of 13.56 MHz in frequency and 30 mW/cm$^3$ in power density was introduced into their deposition chambers through the high-frequency power feed sections 244 and 247, respectively, each formed of a metal electrode made of aluminum. To the semiconductor-forming vacuum vessel 216, high-frequency power of 50 MHz in frequency and 18 mW/cm$^3$ in power density was introduced into its deposition chamber through the high-frequency power feed section 246, formed of a metal electrode made of aluminum. Next, using a continuous module formation apparatus (not shown), the belt-like photovoltaic element thus formed was worked into solar-cell modules of 36 cm×22 cm each.

Then, initial photoelectric conversion efficiency of the solar-cell modules of Example 10 was measured. Thereafter, the solar-cell modules were kept at 50° C., in the state of which these were continuously exposed to solar simulator light of AM 1.5 and 100 mW/cm$^2$, measuring their photoelectric conversion efficiency accordingly. As the result, the solar-cell modules of Example 10 showed photoelectric conversion efficiency of 1.2 times that of the solar-cell modules of Example 9, and also the solar-cell modules of Example 10 had superior adhesion and superior durability against the temperature-humidity test and photodegradation test.

As can be seen from the foregoing, the solar-cell module having the photovoltaic element of the present invention has superior characteristic features.

EXAMPLE 11

Using the deposited-film forming apparatus 601 shown in FIG. 6, the silicon-based semiconductor layer was formed in the following way.

In the same manner as in Example 6, the belt-like conductive substrate 204 was prepared and set in the deposited-film forming apparatus 601, and the insides of the substrate wind-off container 202, semiconductor-forming vacuum vessels 211, 212, 213, 214, 215, 216, 217 and 218 and substrate wind-up container 203 were sufficiently evacuated to a vacuum of 6.7×10$^{-4}$ Pa (5×10$^{-6}$ Torr) by means of an evacuation system consisting of vacuum pumps 261, 262, 263, 264, 265, 266, 267 and 268.

Next, while the evacuation system was operated, source gases and dilute gases were fed into the semiconductor-forming vacuum vessels 212 and 213 through the gas feed pipes 232 and 233, respectively.

200 cm$^3$/min (normal) of H$_2$ gas was also fed into the semiconductor-forming vacuum vessels other than the semiconductor-forming vacuum vessels 212 and 213 through the corresponding gas feed pipes, and 500 cm$^3$/min (normal) of H$_2$ gas was simultaneously fed as gate gas into the respective gas gates through their gate gas feed pipes (not shown). In this state, the evacuation capacity of the evacuation system was regulated to adjust the internal pressure of the semiconductor-forming vacuum vessels 212 and 213 to the desired pressure (pressure of Example 11-1). Film-forming conditions were as shown in Table 19.

At the time the internal pressure of the semiconductor-forming vacuum vessels 212 and 213 became stable, the conductive substrate 204 was started to move from the substrate wind-off container 202 toward the substrate wind-up container 203.

Next, high-frequency power was applied from the high-frequency power sources 252 and 253 to the high-frequency power feed sections 242 and 243 in the semiconductor-forming vacuum vessels 212 and 213, respectively, to cause glow discharge to take place in the deposition chambers in the semiconductor-forming vacuum vessels 212 and 213. Thus, a first silicon-based semiconductor layer region (layer thickness: 200 nm) and a second silicon-based semiconductor layer region (layer thickness: 1,500 nm) were formed on the conductive substrate 204 to form a silicon-based semiconductor layer (Example 11-1). Here, to the semiconductor-forming vacuum vessels 212 and 213, VHF power of 60 MHz in frequency and 18 mW/cm$^3$ in power density was introduced into their deposition chambers through the high-frequency power feed sections 242 and 243, respectively, each formed of a metal electrode made of aluminum. Silicon-based semiconductor layers were formed in the same way but changing the pressure as shown in Table 19 (Examples 11-2 and 11-3).

With regard to the silicon-based semiconductor layers prepared in Examples 11-1, 11-2 and 11-3, their diffraction peaks were measured with an X-ray diffractometer by the use of CuKα rays to examine the proportion of diffraction strength of (220)-plane with respect to the total diffraction strength, and also to determine the Scherrer radius from half width of a diffraction peak of (220)-reflection. The Raman scattering spectra were also measured to examine the ratio of the strength of Raman scattering at 520 cm$^{-1}$ vicinity (caused by the crystal component) to that at 480 cm$^{-1}$ vicinity (caused by the amorphous component). The results of the above are shown in Table 20.

The silicon-based semiconductor layers prepared in Examples 11-1, 11-2 and 11-3 had superior orientation property, crystal grain size and crystallizability. In particular, the silicon-based semiconductor layers prepared in Examples 11-2 and 11-3 formed at a pressure of 400 Pa (2.9 Torr) or above had especially superior characteristics.

EXAMPLE 12

Using the deposited-film forming apparatus 601 shown in FIG. 6, the silicon-based semiconductor layer was formed in the following way.

In the same manner as in Example 6, the belt-like conductive substrate 204 was prepared and set in the deposited-film forming apparatus 601, and the insides of the substrate wind-off container 202, semiconductor-forming vacuum vessels 211, 212, 213, 214, 215, 216, 217 and 218 and substrate wind-up container 203 were sufficiently evacuated to a vacuum of 6.7×10$^{-4}$ Pa (5×10$^{-6}$ Torr) by means of an evacuation system consisting of vacuum pumps 261, 262, 263, 264, 265, 266, 267 and 268.

Next, 3,000 cm$^3$/min (normal) of H$_2$ gas, 500 cm$^3$/min (normal) of SiF$_4$ and 150 cm$^3$/min (normal) of SiH$_4$ were fed into the semiconductor-forming vacuum vessel 212 through the gas feed pipe 232.

Next, while the evacuation system was operated, source gas and dilute gas were fed into the semiconductor-forming vacuum vessel 213 through the gas feed pipe 233 under conditions shown in Table 21 (Examples 12-1 to 12-5).

200 cm$^3$/min (normal) of H$_2$ gas was also fed into the semiconductor-forming vacuum vessels other than the semiconductor-forming vacuum vessels 212 and 213 through the corresponding gas feed pipes, and 500 cm$^3$/min (normal) of H$_2$ gas was simultaneously fed as gate gas into the respective gas gates through their gate gas feed pipes (not shown).

At the time the internal pressure of the semiconductor-forming vacuum vessels 212 and 213 became stable, the conductive substrate 204 was started to move from the substrate wind-off container 202 toward the substrate wind-up container 203.

Next, high-frequency power was applied from the high-frequency power sources 252 and 253 to the high-frequency power feed sections 242 and 243 in the semiconductor-forming vacuum vessels 212 and 213, respectively, to cause glow discharge to take place in the deposition chambers in the semiconductor-forming vacuum vessels 212 and 213. Thus, a first silicon-based semiconductor layer region (layer thickness: 200 nm) and a second silicon-based semiconductor layer region (layer thickness: 1,500 nm) were formed on the conductive substrate 204 to form a silicon-based semiconductor layer.

With regard to the silicon-based semiconductor layers prepared in Examples 12-1, 12-2, 12-3, 12-4, and 12-5, their Scherrer radius was determined from half width of a diffraction peak of (220)-reflection in the same manner as in Example 10. The results are shown in Table 21.

The silicon-based semiconductor layers prepared in Examples 12-1, 12-2, 12-3, 12-4, and 12-5 had superior orientation property, crystal grain size and crystallizability. In particular, the silicon-based semiconductor layers prepared in Examples 12-1, 12-2 and 12-3 in which $SiF_4$ was at a flow rate of 500 cm$^3$/min or lower had good characteristics. Particularly preferred was Example 12-1, in which $SiF_4$ was at a flow rate of 0 cm$^3$/min.

Namely, it is important that the flow rate of $SiF_4$ in the second-step conditions is made not higher than that in the first-step conditions.

EXAMPLE 13

Using the deposited-film forming apparatus 601 shown in FIG. 6, the silicon-based semiconductor layer was formed in the following way.

In the same manner as in Example 6, the belt-like conductive substrate 204 was prepared and set in the deposited-film forming apparatus 601, and the insides of the substrate wind-off container 202, semiconductor-forming vacuum vessels 211, 212, 213, 214, 215, 216, 217 and 218 and substrate wind-up container 203 were sufficiently evacuated to a vacuum of 6.7×10$^{-4}$ Pa (5×10$^{-6}$ Torr) by means of an evacuation system consisting of vacuum pumps 261, 262, 263, 264, 265, 266, 267 and 268.

Next, 3,000 cm$^3$/min (normal) of $H_2$ gas, 500 cm$^3$/min (normal) of $SiF_4$ and 150 cm$^3$/min (normal) of $SiH_4$ were fed into the semiconductor-forming vacuum vessel 212 through the gas feed pipe 232.

Next, while the evacuation system was operated, source gas and dilute gas were fed into the semiconductor-forming vacuum vessel 213 through the gas feed pipe 233.

200 cm$^3$/min (normal) of $H_2$ gas was also fed into the semiconductor-forming vacuum vessels other than the semiconductor-forming vacuum vessels 212 and 213 through the corresponding gas feed pipes, and 500 cm$^3$/min (normal) of $H_2$ gas was simultaneously fed as gate gas into the respective gas gates through their gate gas feed pipes (not shown).

At the time the internal pressure of the semiconductor-forming vacuum vessels 212 and 213 became stable, the conductive substrate 204 was started to move from the substrate wind-off container 202 toward the substrate wind-up container 203.

Next, high-frequency power was applied from the high-frequency power sources 252 and 253 to the high-frequency power feed sections 242 and 243 in the semiconductor-forming vacuum vessels 212 and 213, respectively, to cause glow discharge to take place in the deposition chambers in the semiconductor-forming vacuum vessels 212 and 213. Thus, a first silicon-based semiconductor layer region (layer thickness: 200 nm) and a second silicon-based semiconductor layer region (layer thickness: 1,500 nm) were formed on the conductive substrate 204 to form a silicon-based semiconductor layer. In the present Example 13, when the first silicon-based semiconductor layer region was formed, the pressure was changed from 100 Pa to 700 Pa, and also the distance between electrodes from 5 mm to 25 mm, to make experiments.

With regard to the silicon-based semiconductor layers prepared in Example 13, their Scherrer radius was determined from half width of a diffraction peak of (220)-reflection in the same manner as in Example 12. The results are shown in Table 22.

The silicon-based semiconductor layer 13 had superior orientation property, crystal grain size and crystallizability. In particular, the silicon-based semiconductor layers prepared at a pressure of from 300 Pa to 600 Pa and a distance between electrodes of 20 mm or smaller had good characteristics.

EXAMPLE 14

Using the deposited-film forming apparatus 601 shown in FIG. 6, a photovoltaic element shown in FIG. 4 was formed in the same manner as described previously. The semiconductor layer of this photovoltaic element consists of an n-type semiconductor layer 102-1A, an i-type semiconductor layer 102-2 and a microcrystalline p-type semiconductor layer 102-3A. This photovoltaic element is what is called a p-i-n type single-cell photovoltaic element.

In the same manner as described previously, the belt-like conductive substrate 204 was prepared and set in the deposited-film forming apparatus 201, and the insides of the substrate wind-off container 202, semiconductor-forming vacuum vessels 211, 212, 213, 214, 215, 216, 217 and 218 and substrate wind-up container 203 were sufficiently evacuated to a vacuum of 6.7×10$^{-4}$ Pa (5×10$^{-6}$ Torr) by means of an evacuation system consisting of vacuum pumps 261 to 268.

Next, while the evacuation system was operated, in order to form the n-type semiconductor layer 102-1A, 2,000 cm$^3$/min (normal) of $H_2$ gas, 120 cm$^3$/min (normal) of $SiH_4$, 90 cm$^3$/min (normal) of $PH_3$ and 300 cm$^3$/min (normal) of $SiF_4$ were fed into the semiconductor-forming vacuum vessel 211 through the gas feed pipe 231. Namely, what differed from those described previously was that $SiH_4$ was additionally fed when the n-type semiconductor layer 102-1A was formed.

Then, while the evacuation system was operated, 3,000 cm$^3$/min (normal) of $H_2$ gas and 375 cm$^3$/min (normal) of $SiH_4$ were also fed into the semiconductor-forming vacuum vessel 212 through the gas feed pipe 232.

Next, while the evacuation system was operated, source gas and dilute gas were fed into the semiconductor-forming vacuum vessel 213 through the gas feed pipe 233.

500 cm$^3$/min (normal) of $H_2$ gas was also fed into the semiconductor-forming vacuum vessels other than the semiconductor-forming vacuum vessels 211, 212 and 213 through the corresponding gas feed pipes, and 1,000 cm$^3$/min (normal) of $H_2$ gas was simultaneously fed as gate gas into the respective gas gates through their gate gas feed pipes (not shown). In this state, the evacuation capacity of the evacuation system was regulated to adjust the internal pressure of the semiconductor-forming vacuum vessels 211, 212 213 and 214 to the desired pressure. Film-forming conditions were as shown in Table 23.

The film-forming method of the present example is further detailed here. At the time the internal pressure of the semiconductor-forming vacuum vessels 211, 212 213 and 214 shown in FIG. 6 became stable, the conductive substrate 204 was started to move from the substrate wind-off container 202 toward the substrate wind-up container 203.

Next, high-frequency power was applied from the high-frequency power sources 251 to 254 to the high-frequency power feed sections 241 to 244 in the semiconductor-forming vacuum vessels 211 to 214, respectively, to cause glow discharge to take place in the deposition chambers in the semiconductor-forming vacuum vessels 211 to 214. Thus, an amorphous n-type semiconductor layer (layer thickness: 30 nm), a silicon-based semiconductor layer (layer thickness: 2,300 nm, inclusive of first and second regions) and a microcrystalline p-type semiconductor layer (layer thickness: 10 nm) were formed on the conductive substrate 204 to produce a photovoltaic element. Here, to the semiconductor-forming vacuum vessel 211, high-frequency power of 13.56 MHz in frequency and 5 mW/cm$^3$ in power density was introduced into its deposition chamber through the high-frequency power feed section 241, formed of a metal electrode made of aluminum. To the semiconductor-forming vacuum vessels 212 and 213, high-frequency power of 60 MHz in frequency and 18 mW/cm$^3$ in power density was introduced into its deposition chamber through the high-frequency power feed sections 242 and 243, respectively, each formed of a metal electrode made of aluminum. To the semiconductor-forming vacuum vessel 214, high-frequency power of 13.56 MHz in frequency and 30 mW/cm$^3$ in power density was introduced into its deposition chamber through the high-frequency power feed section 244, formed of a metal electrode made of aluminum. Next, using a continuous module formation apparatus (not shown), the belt-like photovoltaic element thus formed was worked into solar-cell modules of 36 cm×22 cm each.

Photoelectric conversion efficiency of the solar-cell modules produced in Example 14 was measured with a solar simulator (AM 1.5, 100 mW/cm$^2$). As the result, the photoelectric conversion efficiency of each solar-cell module of Example 9 being standardized as 1, the photoelectric conversion efficiency of each solar-cell module produced in Example 14 was in the proportion of 0.93, which was substantially equal.

The adhesion between the conductive substrate and the semiconductor layer was also examined by a cross cut tape test (distance between cuts: 1 mm; number of squares: about 100). Also, solar-cell modules whose initial photoelectric conversion efficiency was previously measured were set in a dark place having a temperature of 85° C. and a humidity of 85%, and were kept there for 30 minutes. Thereafter, these were cooled to a temperature of −20° C. taking 70 minutes and kept thereat for 30 minutes, and were again returned to the temperature of 85° C. and the humidity of 85% taking 70 minutes. This cycle was repeated 100 times, and thereafter the photoelectric conversion efficiency was again measured to examine any changes in photoelectric conversion efficiency caused by this temperature-humidity test. Also, the solar-cell modules whose initial photoelectric conversion efficiency was previously measured were kept at 50° C., in the state of which these were exposed to solar simulator light of AM 1.5 and 100 mW/cm$^2$ for 500 hours. Thereafter, their photoelectric conversion efficiency was again measured to examine any changes in photoelectric conversion efficiency caused by this photodegradation test. The results of these are shown in Table 24.

As can be seen from the foregoing, the same effect of the present invention can be attained also when the SiH$_4$ was added when the n-type semiconductor layer 102-1A was formed, without limitation to the i-type semiconductor layer.

According to the preferred embodiments of the present invention, the silicon-based semiconductor layer having superior crystallinity, crystallizability and orientation property and also having good adhesion to the underlying layer can be formed at high rate. Also, the photovoltaic element having a good photoelectric conversion efficiency and having superior adhesion and environmental resistance can be formed at a low cost where, in the photovoltaic element having at least one set of pin junction (or nip junction) deposited, the above silicon-based semiconductor layer is used as an i-type semiconductor layer.

TABLE 1

| Formation conditions of 212 | Source gas | SiF$_4$: 100 cm$^3$/min (normal) H$_2$: 200 cm$^3$/min (normal) |
| --- | --- | --- |
| | Substrate temperature | 350° C. |
| | Pressure | 53.3 Pa (400 mTorr) |
| Formation conditions of 213 | Source gas | SiH$_4$: 30 cm$^3$/min (normal) H$_2$: 400 cm$^3$/min (normal) |
| | Substrate temperature | 350° C. |
| | Pressure | 26.7 Pa (200 mTorr) |

The "(normal)" in the tables means that the flow rate of a source gas was measured in a normal state.

TABLE 2

| | Example 1 | Comparative Example 1 |
| --- | --- | --- |
| Ratio of diffraction strength of (220) to total diffraction strength | 1 | 0.7* |
| Scherrer radius of (220) | 1 | 0.6* |
| Raman strength ratio (520 cm$^{-1}$/480 cm$^{-1}$) | 1 | 0.45* |

*is normalized with the value for Example 1 being 1.

TABLE 3

| Formation conditions of 212 | Source gas | SiF$_4$: 100 cm$^3$/min (normal) H$_2$: 200 cm$^3$/min (normal) |
| --- | --- | --- |
| | Substrate temperature | 350° C. |
| | Pressure | 53.3 Pa (400 mTorr) |
| Formation conditions of 213 | Source gas | SiF$_4$: 200 cm$^3$/min (normal) H$_2$: 200 cm$^3$/min (normal) |
| | Substrate temperature | 400° C. |
| | Pressure | 26.7 Pa (200 mTorr) |

TABLE 4

| | Example 2 | Comparative Example 1 |
| --- | --- | --- |
| Ratio of diffraction strength of (220) to total diffraction strength | 1 | 0.65* |
| Scherrer radius of (220) | 1 | 0.55* |
| Raman strength ratio (520 cm$^{-1}$/480 cm$^{-1}$) | 1 | 0.45* |

*is normalized with the value for Example 2 being 1.

TABLE 5

| Formation conditions of 211 | Source gas | SiH$_4$: 20 cm$^3$/min (normal) H$_2$: 100 cm$^3$/min (normal) PH$_3$(diluted with H$_2$ to 2%): 30 cm$^3$/min (normal) |
| --- | --- | --- |
| | Substrate temperature | 300° C. |
| | Pressure | 133 Pa (1.0 Torr) |

TABLE 5-continued

| | | |
|---|---|---|
| Formation conditions of 212 | Source gas | SiF$_4$: 100 cm$^3$/min (normal)<br>H$_2$: 300 cm$^3$/min (normal) |
| | Substrate temperature | 350° C. |
| | Pressure | 40 Pa (300 mTorr) |
| Formation conditions of 213 | Source gas | SiH$_4$: 50 cm$^3$/min (normal)<br>H$_2$: 400 cm$^3$/min (normal) |
| | Substrate temperature | 350° C. |
| | Pressure | 26.7 Pa (200 mTorr) |
| Formation conditions of 214 | Source gas | SiH$_4$: 10 cm$^3$/min (normal)<br>H$_2$: 800 cm$^3$/min (normal)<br>BF$_3$(diluted with H$_2$ to 2%): 100 cm$^3$/min (normal) |
| | Substrate temperature | 200° C. |
| | Pressure | 160 Pa (1.2 Torr) |

TABLE 6

| | Example 3 | Comparative Example 2 |
|---|---|---|
| Initial photoelectric conversion efficiency | 1 | 0.80* |
| Number of surviving squares in cross cut tape test | 1 | 0.95* |
| Variation of photoelectric conversion efficiency in temperature-humidity test (efficiency after test/initial efficiency) | 1.0 | 0.90 |
| Variation of photoelectric conversion efficiency in photodegradation test (efficiency after test/initial efficiency) | 1.0 | 0.90 |

*is normalized with the value for Example 3 being 1.

TABLE 7

| | | |
|---|---|---|
| Formation conditions of 211 | Source gas | SiH$_4$: 20 cm$^3$/min (normal)<br>H$_2$: 100 cm$^3$/min (normal)<br>PH$_3$(diluted with H$_2$ to 2%): 30 cm$^3$/min (normal) |
| | Substrate temperature | 300° C. |
| | Pressure | 133 Pa (1.0 Torr) |
| Formation conditions of 212 | Source gas | SiF$_4$: 100 cm$^3$/min (normal)<br>H$_2$: 400 cm$^3$/min (normal) |
| | Substrate temperature | 400° C. |
| | Pressure | 13.3 Pa (100 mTorr) |
| Formation conditions of 213 | Source gas | SiF$_4$: 150 cm$^3$/min (normal)<br>SiH$_4$: 100 cm$^3$/min (normal)<br>H$_2$: 300 cm$^3$/min (normal) |
| | Substrate temperature | 350° C. |
| | Pressure | 13.3 Pa (100 mTorr) |
| Formation conditions of 214 | Source gas | SiH$_4$: 10 cm$^3$/min (normal)<br>H$_2$: 800 cm$^3$/min (normal)<br>BF$_3$(diluted with H$_2$ to 2%): 100 cm$^3$/min (normal) |
| | Substrate temperature | 200° C. |
| | Pressure | 160 Pa (1.2 Torr) |
| Formation conditions of 215 | Source gas | SiH$_4$: 20 cm$^3$/min (normal)<br>H$_2$: 100 cm$^3$/min (normal)<br>PH$_3$(diluted with H$_2$ to 2%): 40 cm$^3$/min (normal) |
| | Substrate temperature | 300° C. |
| | Pressure | 133 Pa (1.0 Torr) |
| Formation conditions | Source gas | SiH$_4$: 20 cm$^3$/min (normal)<br>H$_2$: 100 cm$^3$/min (normal) |

TABLE 7-continued

| | | |
|---|---|---|
| of 216 | Substrate temperature | 300° C. |
| | Pressure | 133 Pa (1.0 Torr) |
| Formation conditions of 217 | Source gas | SiH$_4$: 10 cm$^3$/min (normal)<br>H$_2$: 800 cm$^3$/min (normal)<br>BF$_3$(diluted with H$_2$ to 2%): 100 cm$^3$/min (normal) |
| | Substrate temperature | 200° C. |
| | Pressure | 160 Pa (1.2 Torr) |

TABLE 8

| | | |
|---|---|---|
| Formation conditions of 212 | Source gas | SiF$_4$: 100 cm$^3$/min (normal)<br>H$_2$: 300 cm$^3$/min (normal) |
| | Substrate temperature | 350° C. |
| | Pressure | 4.0 Pa (30 mTorr) (Example 5-1)<br>6.7 Pa (50 mTorr) (Example 5-2)<br>13.3 Pa (100 mTorr) (Example 5-3) |
| Formation conditions of 212 | Source gas | SiH$_4$: 50 cm$^3$/min (normal)<br>H$_2$: 400 cm$^3$/min (normal) |
| | Substrate temperature | 350° C. |
| | Pressure | 13.3 Pa (100 mTorr) |

TABLE 9

| | Example 5-1 | Example 5-2 | Example 5-3 |
|---|---|---|---|
| Pressure | 4.0 Pa (30 mTorr) | 6.7 Pa (50 mTorr) | 13.3 Pa (100 mTorr) |
| Ratio of diffraction strength of (220) to total diffraction strength | 1 | 1.2* | 1.3* |
| Scherrer radius of (220) | 1 | 1.2* | 1.3* |
| Raman strength ratio (520 cm$^{-1}$/480 cm$^{-1}$) | 1 | 1.2* | 1.4* |

*is normalized with the value for Example 5-1 being 1.

TABLE 10

| | | |
|---|---|---|
| Formation conditions of 212 | Source gas | H$_2$: 3000 cm$^3$/min (normal)<br>SiH$_4$: 150 cm$^3$/min (normal)<br>SiF$_4$: 500 cm$^3$/min (normal) |
| | Substrate temperature | 175° C. |
| | Pressure | 400 Pa (2.9 Torr) |
| Formation conditions of 213 | Source gas | H$_2$: 3000 cm$^3$/min (normal)<br>SiH$_4$: 375 cm$^3$/min (normal) |
| | Substrate temperature | 175° C. |
| | Pressure | 400 Pa (2.9 Torr) |

TABLE 11

| | Example 6 | Comparative Example 3 |
|---|---|---|
| Ratio of diffraction strength of (220) to total diffraction strength | 1 | 0.65* |
| Scherrer radius of (220) | 1 | 0.6* |
| Raman strength ratio (221) (520 cm$^{-1}$/480 cm$^{-1}$) | 1 | 0.4* |

*is normalized with value for Example 6 being 1.

TABLE 12

| Formation conditions of 212 | Source gas | H$_2$: 3000 cm$^3$/min (normal)<br>SiH$_4$: 150 cm$^3$/min (normal)<br>SiF$_4$: 500 cm$^3$/min (normal) |
|---|---|---|
| | Substrate temperature | 175° C. |
| | Pressure | 400 Pa (2.9 Torr) |
| Formation conditions of 213 | Source gas | H$_2$: 3000 cm$^3$/min (normal)<br>SiH$_4$: 150 cm$^3$/min (normal)<br>SiF$_4$: 100 cm$^3$/min (normal) |
| | Substrate temperature | 175° C. |
| | Pressure | 400 Pa (2.9 Torr) |

TABLE 13

| | Example 6 | Example 7 |
|---|---|---|
| Ratio of diffraction strength of (220) to total diffraction strength | 1 | 0.98* |
| Scherrer radius of (220) | 1 | 0.97* |
| Raman strength ratio (221) (520 cm$^{-1}$/480 cm$^{-1}$) | 1 | 0.99* |

*is normalized with the value for Example 6 being 1.

TABLE 14

| Formation conditions of 212 | Source gas | SiCl$_2$H$_2$: 450 cm$^3$/min (normal)<br>H$_2$: 3000 cm$^3$/min (normal) |
|---|---|---|
| | Substrate temperature | 175° C. |
| | Pressure | 400 Pa (2.9 Torr) |
| Formation conditions of 213 | Source gas | SiH$_4$: 375 cm$^3$/min (normal)<br>H$_2$: 3000 cm$^3$/min (normal) |
| | Substrate temperature | 200° C. |
| | Pressure | 400 Pa (2.9 Torr) |

TABLE 15

| | Example 8 | Comparative Example 4 |
|---|---|---|
| Ratio of diffraction strength of (220) to total diffraction strength | 1 | 0.6* |
| Scherrer radius of (220) | 1 | 0.5* |
| Raman strength ratio (221) (520 cm$^{-1}$/480 cm$^{-1}$) | 1 | 0.45* |

*is normalized with the valeu for Example 8 being 1.

TABLE 16

| Formation conditions of 211 | Source gas | SiF$_4$: 120 cm$^3$/min (normal)<br>H$_2$: 2000 cm$^3$/min (normal)<br>PH$_3$(diluted with H$_2$ to 2%): 90 cm$^3$/min (normal) |
|---|---|---|
| | Substrate temperature | 380° C. |
| | Pressure | 400 Pa (2.9 Torr) |
| Formation conditions of 212 | Source gas | SiF$_4$: 500 cm$^3$/min (normal)<br>SiH$_4$: 150 cm$^3$/min (normal)<br>H$_2$: 3000 cm$^3$/min (normal) |
| | Substrate temperature | 175° C. |
| | Pressure | 400 Pa (2.9 Torr) |
| Formation conditions of 213 | Source gas | SiH$_4$: 375 cm$^3$/min (normal)<br>H$_2$: 3000 cm$^3$/min (normal) |
| | Substrate temperature | 200° C. |
| | Pressure | 400 Pa (2.9 Torr) |
| Formation conditions of 214 | Source gas | SiH$_4$: 10 cm$^3$/min (normal)<br>H$_2$: 5000 cm$^3$/min (normal)<br>BF$_3$(diluted with H$_2$ to 2%): 150 cm$^3$/min (normal) |
| | Substrate temperature | 160° C. |
| | Pressure | 400 Pa (2.9 Torr) |

TABLE 17

| | Example 9 | Comparative Example 5 |
|---|---|---|
| Initial photoelectric conversion efficiency | 1 | 0.7* |
| Number of surviving squares in cross cut tape test | 1 | 0.9* |
| Variation of photoelectric conversion efficiency in temperature-humidity test (efficiency after test/initial efficiency) | 1 | 0.9 |
| Variation of photoelectric conversion efficiency in photodegradation test (efficiency after test/initial efficiency) | 1 | 0.85 |

*is normalized with the value of Example 9 being 1.

TABLE 18

| Formation conditions of 211 | Source gas | SiH$_4$: 120 cm$^3$/min (normal)<br>H$_2$: 2000 cm$^3$/min (normal)<br>PH$_3$(diluted with H$_2$ to 2%): 90 cm$^3$/min (normal) |
|---|---|---|
| | Substrate temperature | 380° C. |
| | Pressure | 400 Pa (2.9 Torr) |
| Formation conditions of 212 | Source gas | SiF$_4$: 500 cm$^3$/min (normal)<br>SiH$_4$: 150 cm$^3$/min (normal)<br>H$_2$: 3000 cm$^3$/min (normal) |
| | Substrate temperature | 175° C. |
| | Pressure | 400 Pa (2.9 Torr) |
| Formation conditions of 213 | Source gas | SiH$_4$: 375 cm$^3$/min (normal)<br>H$_2$: 3000 cm$^3$/min (normal) |
| | Substrate temperature | 200° C. |
| | Pressure | 400 Pa (2.9 Torr) |
| Formation conditions of 214 | Source gas | SiH$_4$: 10 cm$^3$/min (normal)<br>H$_2$: 5000 cm$^3$/min (normal)<br>BF$_3$(diluted with H$_2$ to 2%): 150 cm$^3$/min (normal) |
| | Substrate temperature | 160° C. |
| | Pressure | 400 Pa (2.9 Torr) |
| Formation conditions of 215 | Source gas | SiH$_4$: 120 cm$^3$/min (normal)<br>H$_2$: 2000 cm$^3$/min (normal)<br>PH$_3$(diluted with H$_2$ to 2%): 90 cm$^3$/min (normal) |
| | Substrate temperature | 250° C. |
| | Pressure | 400 Pa (2.9 Torr) |
| Formation conditions of 216 | Source gas | SiH$_4$: 375 cm$^3$/min (normal)<br>H$_2$: 3000 cm$^3$/min (normal) |
| | Substrate temperature | 200° C. |
| | Pressure | 400 Pa (2.9 Torr) |
| Formation conditions of 217 | Source gas | SiH$_4$: 10 cm$^3$/min (normal)<br>H$_2$: 5000 cm$^3$/min (normal)<br>BF$_3$(diluted with H$_2$ to 2%): 150 cm$^3$/min (normal) |
| | Substrate temperature | 160° C. |
| | Pressure | 400 Pa (2.9 Torr) |

TABLE 19

| Formation conditions of 212 | Source gas | SiF$_4$: 500 cm$^3$/min (normal)<br>SiH$_4$: 150 cm$^3$/min (normal)<br>H$_2$: 3000 cm$^3$/min (normal) |
|---|---|---|
| | Substrate temperature | 175° C. |
| | Pressure | (Example 11-1) 300 Pa (2.2 Torr)<br>(Example 11-2) 400 Pa (2.9 Torr)<br>(Example 11-3) 500 Pa (3.7 Torr) |
| Formation conditions of 213 | Source gas | SiH$_4$: 375 cm$^3$/min (normal)<br>H$_2$: 3000 cm$^3$/min (normal) |
| | Substrate temperature | 200° C. |
| | Pressure | 400 Pa (2.9 Torr) |

TABLE 20

| | Example 11-1 | Example 11-2 | Example 11-3 |
|---|---|---|---|
| Pressure | 300 Pa (2.2 Torr) | 400 Pa (2.9 Torr) | 500 Pa (3.7 Torr) |
| Ratio of diffraction strength of (220) to total diffraction strength | 1 | 1.3* | 1.2* |
| Scherrer radius of (220) | 1 | 1.3* | 1.2* |
| Raman strength ratio (520 cm$^{-1}$/480 cm$^{-1}$) | 1 | 1.4* | 1.3* |

*is normalized with the value for Example 11-1 being 1.

TABLE 21

| | Ex. 12-1 | Ex. 12-2 | Ex. 12-3 | Ex. 12-4 | Ex. 12-5 |
|---|---|---|---|---|---|
| SiF$_4$ flow rate cm$^3$/min (normal) | 0 | 250 | 500 | 750 | 1000 |
| Ratio of diffraction strength of (220) to total diffraction strength | 1.3* | 1.2* | 1.2* | 1* | 1 |
| Scherrer radius of (220) | 1.3* | 1.2* | 1.2* | 1.1* | 1 |
| Raman strength ratio (520 cm$^{-1}$/480 cm$^{-1}$) | 1.4* | 1.2* | 1.1* | 1* | 1 |

*is normalized with the value for Example 12-5 being 1.

TABLE 22

| Pressure | Distance between electrodes (mm) | | | | |
|---|---|---|---|---|---|
| (Pa) | 5 | 10 | 15 | 20 | 25 |
| 100 | 1 | 1.1 | 1 | 1.1 | 1 |
| 200 | 1.1 | 1.1 | 1 | 1 | 1 |
| 300 | 1.2 | 1.1 | 1.2 | 1.2 | 1.1 |
| 400 | 1.4 | 1.4 | 1.4 | 1.3 | 1.2 |
| 500 | 1.4 | 1.4 | 1.3 | 1.3 | 1.1 |
| 600 | 1.3 | 1.4 | 1.3 | 1.2 | 1.2 |
| 700 | 1.2 | 1.1 | 1.1 | 1.1 | 1 |

The above values are values obtained by normalizing Scherrer radii under various conditions with the value of Scherrer radius under conditions of the distance between electrode=5 mm and the pressure=100 Pa being 1.

TABLE 23

| Formation conditions of 211 | Source gas | H$_2$: 2000 cm$^3$/min (normal)<br>SiH$_4$: 120 cm$^3$/min (normal)<br>SiF$_4$: 300 cm$^3$/min (normal)<br>PH$_3$ (diluted with H$_2$ to 2%): 90 cm$^3$/min (normal) |
|---|---|---|
| | Substrate temperature | 380° C. |
| | Pressure | 400 Pa (2.9 Torr) |
| Formation conditions of 212 | Source gas | H$_2$: 3000 cm$^3$/min (normal)<br>SiH$_4$: 150 cm$^3$/min (normal) |
| | Substrate temperature | 175° C. |
| | Pressure | 400 Pa (2.9 Torr) |
| Formation conditions of 213 | Source gas | H$_2$: 5000 cm$^3$/min (normal)<br>SiH$_4$: 10 cm$^3$/min (normal)<br>BF$_3$ (diluted with H$_2$ to 2%): 150 cm$^3$/min (normal) |
| | Substrate temperature | 160° C. |
| | Pressure | 400 Pa (2.9 Torr) |

TABLE 24

| | Ex. 9 | Comp. Ex. 5 | Ex. 14 |
|---|---|---|---|
| Initial photoelectric conversion efficiency | 1 | 0.7* | 0.93* |
| Number of surviving squares in cross cut tape test | 1 | 0.9* | 0.95* |
| Variation of photoelectric conversion efficiency in temperature-humidity test (efficiency after test/initial efficiency) | 1 | 0.9 | 0.97 |
| Variation of photoelectric conversion efficiency in photodegradation test (efficiency after test/initial efficiency) | 1 | 0.85 | 0.95 |

*is normalized with the value for Example 9 being 1.

What is claimed is:

1. A method of forming a silicon-based semiconductor layer by introducing a source gas into a vacuum vessel and forming a silicon-based semiconductor layer containing a microcrystal on a substrate introduced into the vacuum vessel by plasma CVD, which comprises:

a first step of forming a first region with a source gas containing halogen atoms; and a second step of forming a second region on the first region under a condition where the source gas containing halogen atoms is absent or a condition where the source gas containing halogen atoms has a concentration lower than that in the first step, wherein the first region is formed by high frequency plasma CVD using microwaves, and the second region is formed by high frequency plasma CVD using VHF.

2. The method according to claim 1, wherein the halogen atoms are fluorine atoms or chlorine atoms.

3. The method according to claim 1, wherein the formation condition of the first region is higher in etching reaction than the formation condition of the second region.

4. The method according to claim 1, wherein the decomposition rate of the source gas is higher in the formation condition of the second region than in the formation condition of the first region.

5. The method according to claim 1, wherein the formation condition of the first region is higher in nucleus growth than the formation condition of the second region.

6. The method according to any one of claims 1 to 5, wherein the first step is a nucleation step and the second step is a growth step.

7. The method according to any one of claims 1 to 5, wherein the first region and the second region have the same conductivity type.

8. The method according to any one of claims 1 to 5, wherein a source gas containing halogen atoms is not used in the second step.

* * * * *

UNITED STATES PATENT AND TRADEMARK OFFICE
CERTIFICATE OF CORRECTION

PATENT NO. : 6,855,621 B2
DATED : February 15, 2005
INVENTOR(S) : Takaharu Kondo et al.

It is certified that error appears in the above-identified patent and that said Letters Patent is hereby corrected as shown below:

Title page,
Item [56], References Cited, OTHER PUBLICATIONS,
"Enhancement of Optical Aborption…" reference, "Optical Aborption" should read -- Optical Absorption --.

Column 1,
Line 53, "junction." should read -- junctions. --.

Column 4,
Line 57, "gses)" should read -- gases) --.

Column 7,
Line 10, "has." should read -- have. --.

Column 8,
Line 31, "source" should read -- sources --.

Column 9,
Line 50, "less occur" should read -- occur less --; and
Line 55, "less occur." should read -- occur less. --.

Column 10,
Line 48, "method in" should read -- methods in --.

Column 11,
Line 10, "the both" should read -- both of the --; and
Line 16, "solution." should read -- solutions. --.

Column 12,
Line 39, "junction." should read -- junctions. --.

Column 15,
Line 14, "be" should be deleted; and
Line 15, "taken" should read -- takes --.

Column 18,
Lines 18, 22, 29 and 32, "212" should read -- 212, --.

UNITED STATES PATENT AND TRADEMARK OFFICE
CERTIFICATE OF CORRECTION

PATENT NO. : 6,855,621 B2
DATED : February 15, 2005
INVENTOR(S) : Takaharu Kondo et al.

It is certified that error appears in the above-identified patent and that said Letters Patent is hereby corrected as shown below:

Column 22,
Line 39, "container 202 ," should read -- container 202, --;
Line 64, "be" should be deleted; and
Line 65, "taken" should read -- takes --.

Column 23,
Line 27, "6.7×1–4 Pa" should read -- $6.7 \times 10^{-4}$ Pa --.

Column 28,
Line 12, "212" should read -- 212, --.

Column 30,
Line 64, "into" (second occurrence) should be deleted.

Column 35,
Line 3, "212" should read -- 212, --.

Column 39,
Table 15, "valeu" should read -- value --.

Column 41,
Table 21, "($520 \text{ cm}^{-1}/480 \text{ cm}^{-1}$" should read -- ($520 \text{ cm}^{-1}/480 \text{ cm}^{-1}$) --.

Signed and Sealed this

Seventh Day of February, 2006

JON W. DUDAS
*Director of the United States Patent and Trademark Office*